United States Patent
Kim et al.

(10) Patent No.: US 10,389,362 B2
(45) Date of Patent: Aug. 20, 2019

(54) DEVICE AND METHOD TO CALIBRATE FREQUENCY

(71) Applicant: SAMSUNG ELECTRONICS CO., LTD., Suwon-si (KR)

(72) Inventors: Seong Joong Kim, Hwaseong-si (KR); Sang Joon Kim, Hwaseong-si (KR); Jong Pal Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 77 days.

(21) Appl. No.: 15/610,112

(22) Filed: May 31, 2017

(65) Prior Publication Data

US 2018/0006655 A1    Jan. 4, 2018

(30) Foreign Application Priority Data

Jul. 4, 2016   (KR) ................. 10-2016-0084310

(51) Int. Cl.
 *H03J 7/00*   (2006.01)
 *H03L 1/02*   (2006.01)
 *H03L 7/23*   (2006.01)

(52) U.S. Cl.
 CPC ............. *H03L 1/02* (2013.01); *H03J 7/00* (2013.01); *H03L 7/23* (2013.01)

(58) Field of Classification Search
 CPC .............. H03L 7/085; H03L 7/00; H03L 7/23
 See application file for complete search history.

(56) References Cited

U.S. PATENT DOCUMENTS

| | | | |
|---|---|---|---|
| 6,160,449 A * | 12/2000 | Klomsdorf | H03F 1/0205 330/149 |
| 8,032,102 B2 | 10/2011 | Molnar et al. | |
| 8,326,246 B2 | 12/2012 | Monat et al. | |
| 8,913,648 B2 * | 12/2014 | Kang | H04B 1/1027 375/219 |
| 2014/0167865 A1 * | 6/2014 | Simons | H03L 5/00 331/15 |
| 2015/0207514 A1 | 7/2015 | Kim et al. | |
| 2015/0295543 A1 | 10/2015 | Brown et al. | |

FOREIGN PATENT DOCUMENTS

| | | |
|---|---|---|
| CN | 104796140 A | 7/2015 |
| JP | 10-256928 A | 9/1998 |
| KR | 10-2015-0004977 A | 1/2015 |
| KR | 10-2015-0086838 A | 7/2015 |

(Continued)

OTHER PUBLICATIONS

Bae, Joonsung, et al. "A 490uW Fully MICS Compatible FSK Transceiver for Implantable Devices." *VLSI Circuits, 2009 Symposium on.* IEEE, 2009. (2 pages, in English).

(Continued)

*Primary Examiner* — Jeffrey M Shin
(74) *Attorney, Agent, or Firm* — NSIP Law

(57) ABSTRACT

A frequency calibration device includes an input signal generator configured to generate an input signal based on an oscillation signal and an external signal, an envelope detector configured to detect an envelope signal corresponding to the input signal, and a frequency tuner configured to tune an oscillation frequency of the oscillation signal based on an envelope frequency corresponding to the envelope signal.

20 Claims, 17 Drawing Sheets

(56) References Cited

FOREIGN PATENT DOCUMENTS

| KR | 10-2015-0086886 A | 7/2015 |
| KR | 10-2016-0031311 A | 3/2016 |
| KR | 10-2017-0082776 A | 7/2017 |

OTHER PUBLICATIONS

Bohorquez, Jose L., et al. "A 350μW CMOS MSK Transmitter and 400μW OOK Super-Regenerative Receiver for Medical Implant Communications." *IEEE Journal of Solid-State Circuits* 44.4 (2009): 1248-1259. (12 pages, in English).

Bohorquez, Jose L., et al. "A 350μW CMOS MSK Transmitter and 400μW OOK Super-Regenerative Receiver for Medical Implant Communications." *2008 Symposium on VLSI Circuits Digest of Technical Papers* (2008): 32-33. (2 pages, in English).

Chen, Jia-Yi, et al. "A Fully Integrated Auto-Calibrated Super-Regenerative Receiver in 0.13-μm CMOS." *IEEE Journal of Solid-state Circuits* 42.9 (2007): 1976-1985. (10 pages, in English).

Razavi, Behzad. "A Study of Injection Locking and Pulling in Oscillators." *IEEE Journal of Solid-State Circuits* 39.9 (2004): 1415-1424. (10 pages, in English).

\* cited by examiner

DEVICE AND METHOD TO CALIBRATE FREQUENCY

CROSS-REFERENCE TO RELATED APPLICATIONS

This application claims the benefit under 35 USC 119(a) of Korean Patent Application No. 10-2016-0084310 filed on Jul. 4, 2016 in the Korean Intellectual Property Office, the entire disclosure of which is incorporated herein by reference for all purposes.

BACKGROUND

1. Field

The following description relates to a device and method to calibrate a frequency.

2. Description of Related Art

A super-regenerative receiver (SRR) is known as a low cost, easily configurable receiver having appropriate reception sensitivity. SRRs have been widely applied to a variety of fields, such as, for example, the fields of remote-control toys, information systems, and monitoring devices.

An SRR detects a signal based on a startup time of an oscillator. The startup time of the oscillator is based on a power and a frequency of a signal received by an antenna. When such an input signal is absent, the oscillator may oscillate very slowly due to thermal noise, according to a magnitude of direct current (DC) bias set in the oscillator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a frequency calibration device includes an input signal generator configured to generate an input signal based on an oscillation signal and an external signal, an envelope detector configured to detect an envelope signal corresponding to the input signal, and a frequency tuner configured to tune an oscillation frequency of the oscillation signal based on an envelope frequency corresponding to the envelope signal.

The input signal generator may include an amplifier configured to amplify the external signal based on a gain set so that an oscillator generates a signal in which the oscillation signal and the external signal are intermodulated as the input signal.

The input signal generator may include a gain controller configured to tune the gain in response to determining that the input signal is not the signal in which the oscillation signal and the external signal are intermodulated.

The frequency tuner may be further configured to tune the oscillation frequency of the oscillation signal so that the envelope frequency of the envelope signal is less than or equal to a threshold frequency.

The input signal generator may include an oscillator including an inductor and a capacitor, and configured to operate at an oscillation frequency determined by the inductor and the capacitor, and the oscillator may be further configured to generate, as the input signal, one of an injection locked signal having an external frequency of the external signal, a natural oscillation signal having the oscillation frequency, and an intermodulated signal having a value of a frequency difference between the external frequency and the oscillation frequency, based on the external frequency of the external signal and the oscillation frequency.

The capacitor may include a capacitor bank that includes capacitors, and the frequency tuner may be further configured to control a capacitance of the capacitor by determining a control code for the capacitor bank, and to decrease the envelope frequency of the envelope signal by tuning the oscillation frequency.

The capacitor may include a first capacitor bank configured to be swept based on a first capacitance unit in response to a control code, and a second capacitor bank configured to be swept based on a second capacitance unit in response to the control code, wherein the first capacitance unit is greater than the second capacitance unit.

The frequency tuner may include a direct current remover configured to remove a direct current signal from the envelope signal, and to extract an alternating current signal, an amplifier configured to amplify the alternating current signal to produce an amplified alternating current signal, a counter configured to count a number of oscillations in which the amplified alternating current signal exceeds a threshold magnitude during a mask time, and a comparator configured to tune the oscillation frequency based on the counted number of oscillations.

The frequency calibration device may further include a transmitter configured to transmit a signal to an outside area based on the tuned oscillation frequency.

The input signal generator may be further configured to initialize the oscillation frequency to a target frequency set for a frequency channel of the external signal, in response to definition of the frequency channel of the external signal.

The frequency calibration device may further include a temperature measurer configured to measure a temperature of at least a portion of the frequency calibration device, wherein the frequency tuner is further configured to detect the envelope signal and to tune the oscillation frequency again in response to the measured temperature being greater than a threshold temperature.

In another general aspect, a frequency calibration method includes generating an input signal based on an oscillation signal and an external signal, detecting an envelope signal of the input signal, and tuning an oscillation frequency of the oscillation signal based on an envelope frequency corresponding to the envelope signal.

The method may further include amplifying the external signal based on a gain, tuning the gain in response to not detecting the envelope frequency from the envelope signal, and repeatedly tuning the gain until the envelope frequency is detected.

The tuning of the oscillation frequency may include tuning the oscillation frequency of the oscillation signal so that the envelope frequency of the envelope signal is less than or equal to a threshold frequency.

The tuning of the oscillation frequency may include tuning the oscillation frequency by changing a capacitance of an oscillator, sequentially changing the capacitance until the envelope frequency is not detected, tuning a gain for amplifying the external signal, in response to an envelope frequency detected from a capacitance set prior to changing to a capacitance from which an envelope frequency is not detected exceeding a threshold frequency, and maintaining the capacitance, in response to the envelope frequency detected from the capacitance set prior to changing to the capacitance from which the envelope frequency is not detected being less than or equal to the threshold frequency.

The tuning of the oscillation frequency may include changing a capacitance of at least one of a first capacitor and a second capacitor included in an oscillator.

The changing of the capacitance may include sequentially changing a capacitance of the first capacitor until the envelope frequency is not detected, tuning a gain for amplifying the external signal and then changing the capacitance of the first capacitor again, in response to the envelope frequency detected from the envelope signal exceeding a first threshold frequency in a state in which the first capacitor is set to a capacitance changed prior to changing to a capacitance from which an envelope frequency is not detected, sequentially changing a capacitance of the second capacitor until the envelope frequency is not detected, in response to the envelope frequency detected from the envelope signal being less than or equal to the first threshold frequency in a state in which the first capacitor is set to the capacitance changed prior to changing to the capacitance from which the envelope frequency is not detected, tuning the gain for amplifying the external signal and then changing the capacitance of the second capacitor again, in response to the envelope frequency detected from the envelope signal exceeding a second threshold frequency in a state in which the second capacitor is set to the capacitance changed prior to changing to the capacitance from which the envelope frequency is not detected, and maintaining the capacitance of the first capacitor and the capacitance of the second capacitor in response to the envelope frequency detected from the envelope signal being less than or equal to the second threshold frequency in a state in which the second capacitor is set to the capacitance changed to prior to changing to the capacitance from which the envelope frequency is not detected.

The method may further include initializing a capacitor included in an oscillator to a center value of a maximum capacitance of the capacitor, and initializing a gain of the external signal to a maximum gain of an amplifier.

The method may further include coarsely initializing the oscillation frequency based on a baseband frequency, in response to a target channel given to correspond to the external signal.

In another general aspect, a non-transitory computer-readable medium stores instructions that, when executed by a processor, cause the processor to perform the method described above.

Other features and aspects will be apparent from the following detailed description, the drawings, and the claims.

Figure 1:
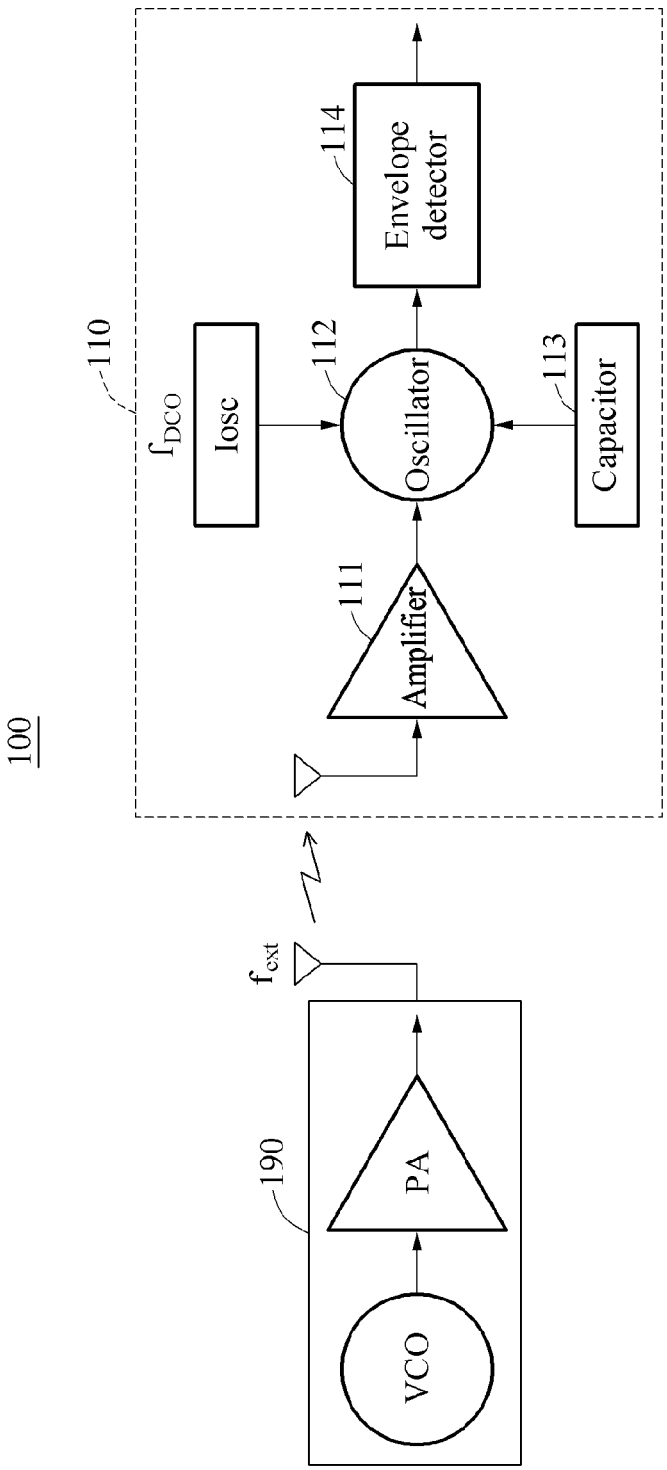
FIG. 1 is a diagram illustrating an example of a configuration of a frequency calibration system.

Throughout the drawings and the detailed description, unless otherwise described or provided, the same drawing reference numerals will be understood to refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Hereinafter, examples will be described with reference to the accompanying drawings. However, the scope of the present application is not limited thereto or restricted thereby. Like reference numerals in the drawings refer to like constituent elements throughout.

The terminology used herein is for the purpose of describing particular examples only, and is not to be used to limit the disclosure. As used herein, the terms "a," "an," and "the," are intended to include the plural forms as well, unless the context clearly indicates otherwise. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Unless otherwise defined, all terms including technical and scientific terms used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

When describing the examples with reference to the accompanying drawings, like reference numerals refer to like constituent elements and a repeated description related thereto will be omitted. When it is determined discussions related to a related known operation or configuration that may make the purpose of the examples unnecessarily ambiguous in describing the examples, such discussions in the detailed description will be omitted here.

FIG. 1 illustrates an example of a configuration of a frequency calibration system.

Referring to the example of FIG. 1, a frequency calibration system 100 includes a frequency calibration device 110 and a signal transmission device 190.

The signal transmission device 190 generates an external signal, and transmits the generated external signal to the frequency calibration device 110 via an antenna. In the example of FIG. 1, the external signal indicates a signal having a corresponding external frequency $f_{ext}$. The signal transmission device 190 includes a voltage-controlled oscillator (VCO) configured to oscillate at the external frequency $f_{ext}$ and a power amplifier (PA) configured to amplify an output of the VCO. However, the signal transmission device 190 is not limited to these elements, and may include other appropriate elements to assist in the generation and transmission of the external signal. In such an example, an external frequency $f_{ext}$ of the external signal is determined at the VCO of the signal transmission device 190. However, in the other examples, the external frequency $f_{ext}$ is determined in different ways.

In the example of FIG. 1, the frequency calibration device 110 includes an amplifier 111, an oscillator 112, a capacitor 113, and an envelope detector 114. However, the signal transmission device 190 is not limited to these elements, and may include other appropriate elements to assist in the operation of the frequency calibration device 110.

The amplifier 111 amplifies the external signal received from the signal transmission device 190 via the antenna of the frequency calibration device 110. In an example, a gain of the amplifier 111 is tuned and the external signal decrease based on the tuned gain. Such an example is described further, below.

In conjunction with the amplifier 111, the oscillator 112 generates an input signal based on the amplified external signal and an oscillation signal. For example, the oscillator 112 is a digitally controlled oscillator (DCO). However, other types of oscillator may be used, as appropriate, in other examples. In such an example, an oscillation frequency $f_{DCO}$ that is a natural oscillation frequency of the oscillation signal is determined based on results of using the capacitor 113. In an example, the capacitor 113 includes a capacitor included in an LC tank configured to set the oscillation frequency $f_{DCO}$ of the oscillator 112. In such an example, such an LC tank refers to a tuned circuit including an inductor and a capacitor. In this example, the oscillation frequency $f_{DCO}$ may indicate a resonant frequency of the LC tank. In such an example, a frequency of the input signal is determined as being one of the external frequency $f_{ext}$ of the external signal, the oscillation frequency $f_{DCO}$ of the oscillation signal, and a frequency in which the external frequency $f_{ext}$ and the oscillation frequency $f_{DCO}$ are mixed. For example, as a mixed frequency, a frequency of a signal in which the external signal and the oscillation signal are intermodulated, based on a mode that is determined based on a magnitude of the external signal and a magnitude of the oscillation signal may be used. Although FIG. 1 illustrates that the capacitor 113 is separate from the oscillator 112 for clarity of description, the capacitor 113 is optionally embedded in the oscillator 112 in another example.

The oscillation frequency used by way of example represents a natural oscillation frequency of the oscillator 112 as an operating frequency of the oscillator 112. However, as noted above, other frequencies apply in the context of other examples.

In the example of FIG. 1, the envelope detector 114 detects an envelope signal corresponding to an envelope of the input signal generated at the oscillator 112. For example, an envelope frequency of the envelope signal is a frequency, for example, 0 Hz less than or equal to a threshold frequency. Alternatively, an envelope frequency of the envelope signal is a frequency difference corresponding to a difference between the external frequency $f_{ext}$ and the oscillation frequency $f_{DCO}$, based on a mode of the input signal. The example directed to an envelope frequency of the envelope signal based on the mode of the input signal is described further, below.

In one example, the frequency calibration device 110 applies to operating in the context of a super regenerator oscillator (SRO) and a super regenerative receiver (SRR). The frequency calibration device 110 dynamically controls changes to an operating frequency, for example, an oscillation frequency, of the SRO in a consecutive manner during an operation of the SRR. Additionally, the frequency calibration device 110 prevents drift of a channel frequency that potentially occur in a phase locked loop (PLL) scheme. Accordingly, the frequency calibration device operates at a low power and a chip size is minimized or, alternatively put, reduced. Furthermore, the frequency calibration device 110 is able to operate without using a temperature compensated crystal oscillator (TCXO). Thus, the fine frequency calibration is guaranteed to occur successfully while minimizing a bill of material (BOM). For example, the frequency calibration device 110 is able to achieve an accuracy level of about 100 parts per million (ppm).

Figure 2:
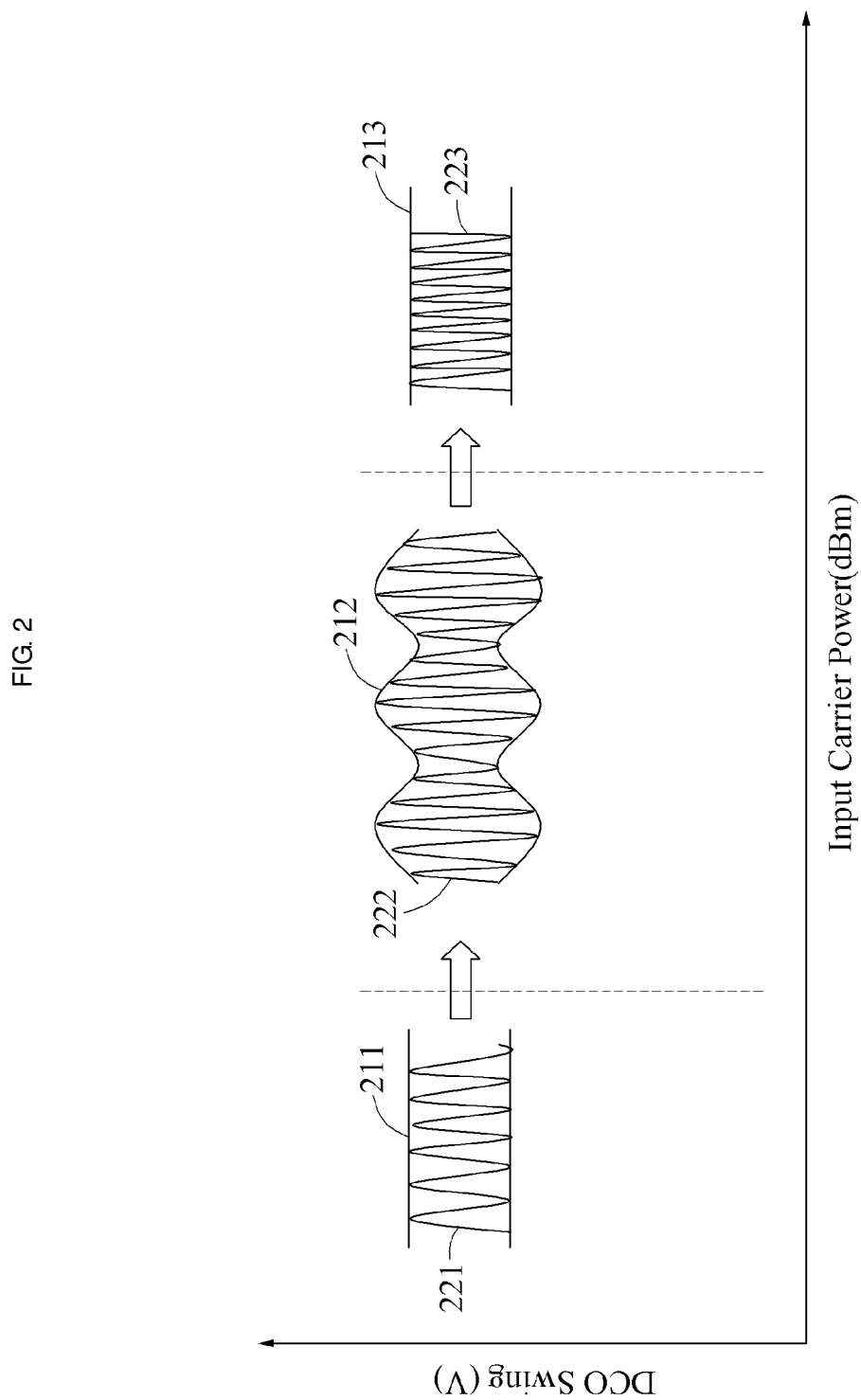
FIG. 2 illustrates an example of a mode of an input signal based on a magnitude of an external signal at a frequency calibration device.

FIG. 2 illustrates an example of a mode of an input signal based on a magnitude of an external signal at a frequency calibration device.

An input signal may be classified into three modes based on a magnitude of a corresponding external signal. In the example of FIG. 2, the x axis denotes input carrier power included in the external signal, and the y axis denotes a swing of the input signal that is an output of an oscillator based on the external signal and an oscillation signal. For example, a unit of the x axis is dBm and a unit of the y axis is V that is a unit of voltage. However, the examples are not limited thereto, and other units may be used, as appropriate.

Referring to the example of FIG. 2, the input signal generated based on the external signal and the oscillation signal, as discussed above, shows a gradual change from a left shape in FIG. 2 to a right shape in FIG. 2, according to an increase in a magnitude of the external signal, for example, the input carrier power.

The left shape of FIG. 2 refers to an input signal 221 of a first mode generated in an example in which a magnitude of the external signal is less than a magnitude of the oscillation signal. An input frequency of the input signal 221 of the first mode corresponds to an oscillation frequency that is determined based on an LC tank included in the oscillator, as discussed above. Because an envelope is generated in a direct current (DC) shape in the input signal 221 of the first mode, the input signal 221 of the first mode is generated in such an example so that an envelope frequency of an envelope signal 211 is zero or a value that is close to zero. Accordingly, the input signal 221 of the first mode is able to have an oscillation frequency of the oscillation signal as a primary component and have no amplitude modulation (AM) included in the input signal 221.

The middle shape of FIG. 2 refers to an input signal 222 of a second mode generated in an example in which a difference between the magnitude of the external signal and the magnitude of the oscillation signal is within a desired, or, alternatively put, predetermined range. An input frequency of the input signal 222 of the second mode includes a signal component that corresponds to the oscillation frequency that is determined based on the LC tank included in the oscillator, as discussed above. Furthermore, the input signal 222 of the second mode further includes a signal component, for example, an envelope signal 212, that corresponds to an envelope frequency in which an oscillation frequency and an external frequency are intermodulated. For example, the input signal 222 of the second mode may be a signal in which the external signal and the oscillation signal are amplitude modulated, such as being a signal that includes a signal component of the oscillation frequency and a signal component having a frequency difference between the oscillation frequency and the external frequency. In such an example, an envelope frequency of the envelope signal 212 that is generated in the input signal 222 of the second mode corresponds to the frequency difference between the oscillation frequency and the external frequency.

The right shape of FIG. 2 refers to an input signal 223 of a third mode generated in an example in which the magnitude of the external signal is greater than the magnitude of the oscillation signal. An input frequency of the input signal 223 of the third mode corresponds to an external frequency of the external signal. Because an envelope signal 213 is generated in a DC shape in the input signal 223 of the third mode, the input signal 223 of the third mode is generated, in an example, so that an envelope frequency is zero or a value close to zero, which is similar to the input signal 221 of the first mode. Accordingly, in such an example, the input signal 223 of the third mode has an external frequency of the external signal as a primary component. For example, the input signal 223 of the third mode is an injection locked signal with respect to the external signal. Therefore, in such an example, the input signal 223 of the third mode is a signal having no AM performed on the signal.

In one example, the frequency calibration device generates the input signal 222 of the second mode by appropriately tuning a gain of the external frequency. In such an example, the frequency calibration device synchronizes the oscillation frequency of the frequency calibration device with the external frequency by extracting the envelope signal 212 from the input signal 222 of the second mode and by tuning the oscillation frequency appropriately so that the envelope frequency of the extracted signal 212 becomes zero as a result. In the input signal 222 of the second mode, the envelope frequency of the input signal 222 refers to a frequency difference between the external signal and the oscillation signal. Thus, the frequency calibration device dynamically tunes the oscillation frequency of the oscillation signal to be equal to the external frequency of the external signal by tuning the envelope frequency to become zero, thereby managing the oscillation frequency as appropriate.

Figure 3:
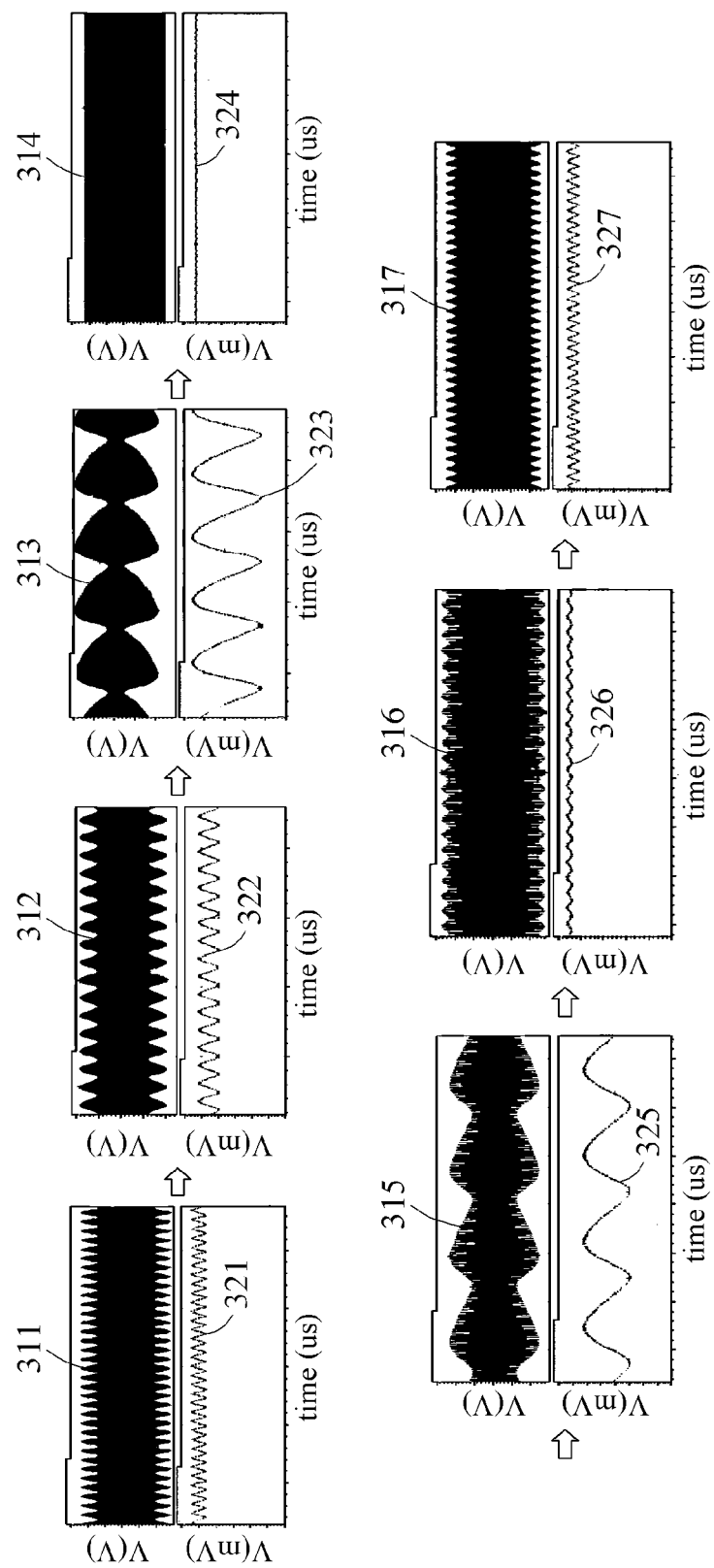
FIG. 3 illustrates an example of a change in an input signal based on a change in a magnitude of an external signal at a frequency calibration device.

FIG. 3 illustrates an example of a change in an input signal based on a change in a magnitude of an external signal at a frequency calibration device.

FIG. 3 illustrates an example in which a difference between a magnitude of an external signal and a magnitude of an oscillation signal is within a desired, or, alternatively put, predetermined, range, and input signals 311, 312, 313, 314, 315, 316, and 317 are generated in a second mode. For example, along a direction indicated by indicators with an arrowhead, FIG. 3 illustrates the input signals 311, 312, 313, 314, 315, 316, and 317 and envelope signals 321, 322, 323, 324, 325, 326, and 327 of the corresponding input signals 311, 312, 313, 314, 315, 316, and 317, according to an increase in the magnitude of the external signal.

Referring to the example of FIG. 3, according to an increase in the magnitude of the external signal, envelope frequencies of the envelope signals 321, 322, and 323 gradually decrease. If the external signal has a specific magnitude, envelope frequencies of the envelope signal 324 become zero. If the magnitude of the external signal further increases, envelope frequencies of the envelope signals 325, 326, 327 also further increase according.

Subsequently, a process in which the frequency calibration device that minimizes an envelope frequency, for example, by tuning the envelope frequency to zero or a value close to zero, is described further.

Figure 4:
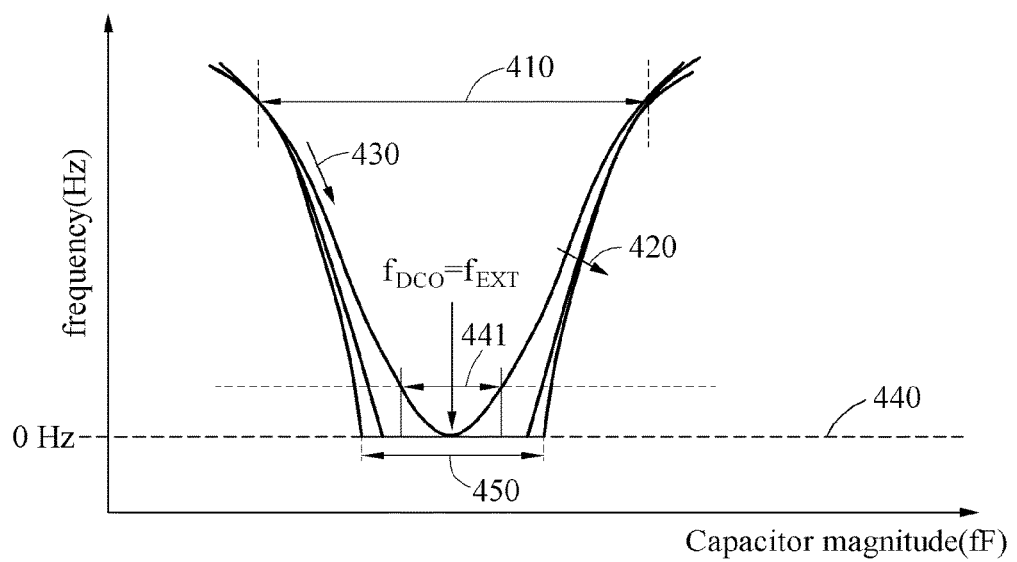
FIG. 4 is a graph showing an example of an envelope frequency of an envelope signal based on a change in a capacitor magnitude of an oscillator included in a frequency calibration device.

FIG. 4 is a graph showing an example of an envelope frequency of an envelope signal based on a change in a capacitor magnitude of an oscillator included in a frequency calibration device.

Referring to the example of FIG. 4, when an envelope frequency is within a locking range 410, the frequency calibration device tracks an external frequency $f_{EXT}$ of an external signal. For example, the locking range 410 indicates the range in which an envelope frequency corresponding to a difference between the external frequency $f_{EXT}$ and an oscillation frequency $f_{DCO}$ is within +50 Mhz to −50 Mhz. When the envelope frequency is within the locking range 410, the frequency calibration device tunes an oscillation frequency of the oscillator to be equal to an external frequency by changing a capacitor magnitude so that the envelope frequency is within a preset threshold frequency 440.

In one example, a relationship between the capacitor magnitude of the oscillator and the oscillation frequency $f_{DCO}$ varies based on the magnitude of the external signal and the magnitude of the oscillation signal. For example, each line of FIG. 4 represents an envelope frequency change aspect of the envelope signal according to a change in the oscillation frequency, and a shape of each envelope frequency change aspect varies based on the magnitude of the external signal. The three lines present in FIG. 4 are examples of the envelope frequency change aspect of the envelope signal based on different magnitudes of external signals.

In the example of FIG. 4, the y axis refers to an envelope frequency of an envelope signal based on a unit of Hz, and the x axis refers to a magnitude of a capacitor included in the frequency calibration device based on a unit of fF. The oscillation frequency $f_{DCO}$ of the oscillator is determined based on a corresponding capacitor magnitude. However, in examples, a unit of the capacitor is not limited to being measured in units of fF and may optionally be variously measured in various alternative scales, such as pF and so on. For example, if the magnitude of the external signal gradually increases during operation, a corresponding shape, for example, the envelope frequency change aspect, of a relationship graph between the capacitor magnitude and the envelope frequency is potentially gradually modified based on a first direction 420.

For example, an injection locking section 450 associated with the graph may increase. In such an example, in the injection locking section 450, according to an increase in the magnitude of the external signal, the oscillation frequency $f_{DCO}$ of the oscillation signal is not the same as the external frequency $f_{EXT}$, and the frequency of the input signal is tuned based on the external frequency $f_{EXT}$ accordingly. In the injection locking section 450, the input frequency of the oscillator is tuned based on the external signal or the oscillation signal and the envelope signal is not generated. Thus, the envelope frequency becomes zero.

In addition, when the frequency calibration device adjusts a gain of the external signal to correspond to a desired value, the envelope frequency is determined based on a relationship between the envelope frequency and a capacitor magnitude corresponding to the gain. For example, when the frequency calibration device changes a magnitude of the capacitor of the oscillator to a desired capacitance magnitude, the envelope frequency is be determined to correspond to a second direction 430 based on an envelope frequency change aspect that represents a relationship between the envelope frequency and a capacitor magnitude corresponding to the currently selected gain value. For example, if the frequency calibration device gradually increases the magnitude of the capacitor value of the oscillator, the envelope frequency gradually decreases to become zero based on the envelope frequency change aspect being caused to correspond to the currently selected gain and then gradually increase again.

In the example of FIG. 4, the frequency calibration device is designed to change the capacitor of the oscillator to minimize, or, alternatively put, reduce, the difference between the oscillation frequency $f_{DCO}$ and the external frequency $f_{EXT}$, for example, so that the envelope frequency becomes zero as a result. In such an example, to achieve the above goal, the frequency calibration device sets the capacitor of the oscillator so that the envelope frequency is less than or equal to the preset threshold frequency 440. In this example, a section 441 in which the envelope frequency is less than or equal to the preset threshold frequency 440 refers to a section in which the difference between the oscillation frequency $f_{DCO}$ and the external frequency $f_{EXT}$ is minimized by the operation of the frequency calibration device. For example, in the section 441 in which the envelope frequency is less than or equal to the threshold frequency 440, the difference between the oscillation frequency $f_{DCO}$ and the external frequency $f_{EXT}$ may have a value of less than 100 ppm.

Figure 5:
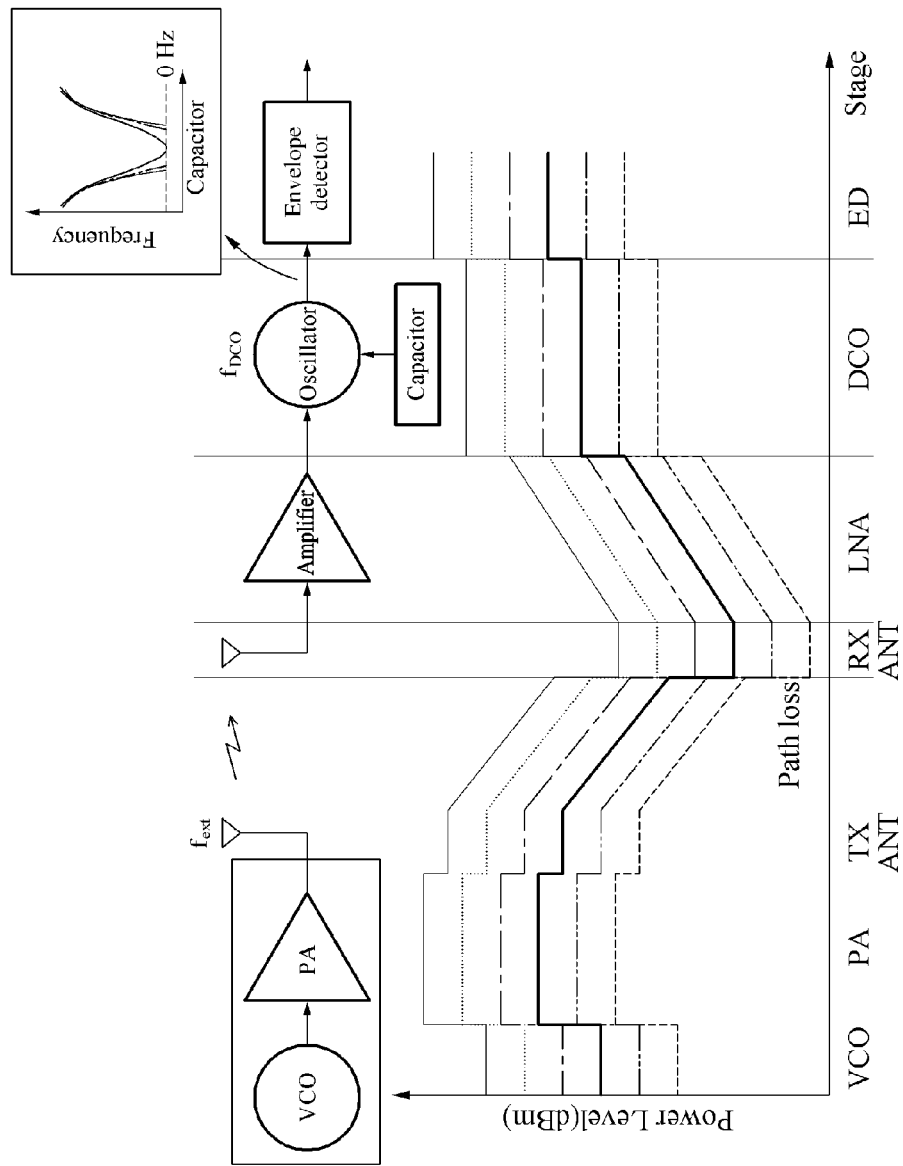
FIGS. 5 and 6 illustrate examples of a power level of a signal at each stage depending on whether a gain of an amplifier is variable.
Figure 6:
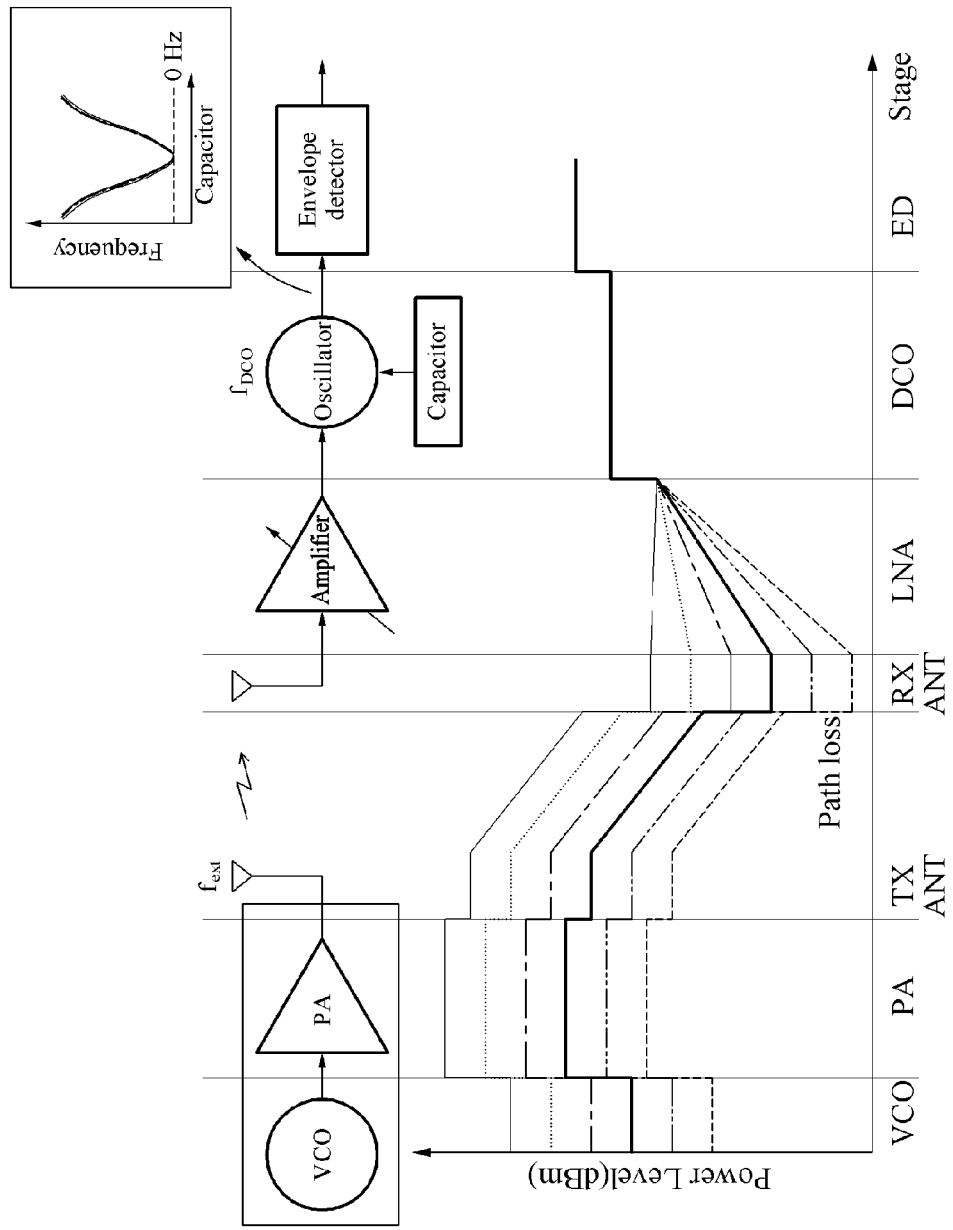

FIGS. 5 and 6 illustrate examples of a power level of a signal at each stage depending on whether a gain of an amplifier is variable.

FIG. 5 illustrates an example of a power level at each stage in an example in which a gain of an amplifier is fixed. By contrast, FIG. 6 illustrates an example of a power level at each stage in an example in which a gain of an amplifier is variable.

Referring to the examples of FIGS. 5 and 6, a power level of a signal is determined based on a channel status up to a VCO stage, for example, an oscillator, of a signal transmission device, a PA stage, for example, an amplifier of the signal transmission device, a TX ANT stage, for example, an antenna, a path loss stage, for example, a channel between the signal transmission device and the frequency calibration device, and an RX ANT stage, for example, an antenna of the frequency calibration device. In a section before a low noise amplifier (LNA) stage, a power level of a signal corresponding to each stage is determined, based on a magnitude at which the external signal is initially generated, regardless of a gain of the amplifier.

In the example of FIG. 5, the gain of the amplifier is fixed. Accordingly, in the example of FIG. 5, an injection locking section appears based on a magnitude of an external signal input into the oscillator of the frequency calibration device after the LNA stage, for example, the amplifier of the frequency calibration device. In such an example, the injection locking section refers to a range and a section in which a frequency of an input signal generated at the oscillator is synchronized with a frequency of the external signal. In the structure of the example of FIG. 5, the gain of the amplifier of the frequency calibration device is not tuned and thus, the injection locking section appears at an envelope frequency of an envelope signal extracted from the input signal generated at the oscillator.

By contrast to the example of FIG. 5, in the example of FIG. 6, the gain of the amplifier is tunable. Accordingly, the frequency calibration device is able to minimize the injection locking range by tuning a power level of a signal input into the oscillator after the LNA stage.

For example, the frequency calibration device prevents injection locking from occurring by tuning a gain of the amplifier for an external signal. In such an example, the frequency calibration device tunes the gain of the external signal and maintains the input signal generated at the oscillator based on the external signal and the oscillation signal to be in the second mode, for example, an intermodulation mode, by showing a sharp frequency selectivity characteristic. In addition, in such an example, the frequency calibration device tunes a mode of the input signal generated at the oscillator, for example, maintaining the input signal to be in the second mode, regardless of a magnitude of the external signal. Furthermore, although a magnitude of the external signal varies during a communication process, the frequency calibration device tunes the mode of the input signal regardless, for example, maintains the input signal to be in the second mode by dynamically tuning the gain of the external signal.

Figure 7:
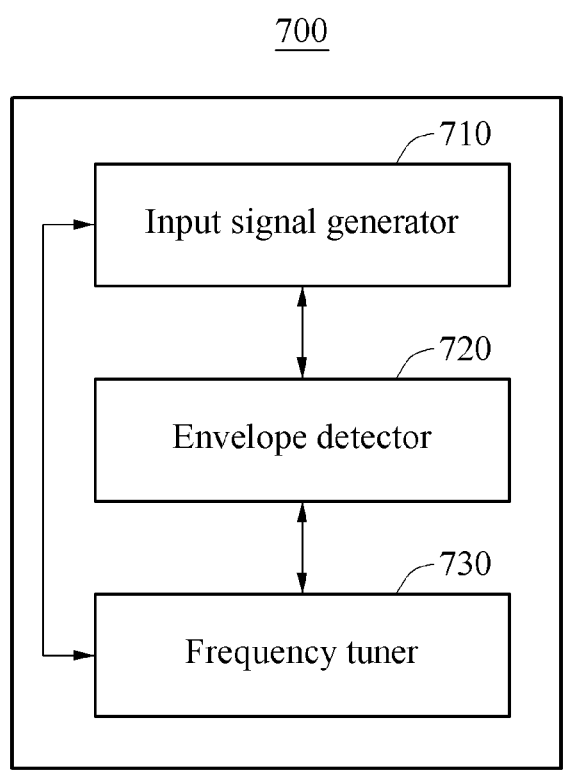
FIG. 7 is a block diagram illustrating an example of a configuration of a frequency calibration device.

FIG. 7 is a block diagram illustrating an example of a configuration of a frequency calibration device.

Referring to the example of FIG. 7, a frequency calibration device 700 includes an input signal generator 710, an envelope detector 720, and a frequency tuner 730.

According to the example of FIG. 7, the input signal generator 710 generates an input signal based on an oscillation signal and an external signal. Such generation has been described further above. The input signal generator 710 includes an amplifier configured to amplify the external signal based on a gain, wherein the gain is set so that an oscillator generates a signal in which the oscillation signal and the external signal are intermodulated as the input signal. Also, the input signal generator 710 includes a gain controller configured to tune the gain in response to determining that the input signal is not the signal in which the external signal and the oscillation signal are intermodulated.

In one example, the input signal generator 710 includes the oscillator. In a particular example, the oscillator includes an inductor and a capacitor, as discussed, and is configured to operate at an oscillation frequency determined by the inductor and the capacitor. However, the oscillator is potentially structured differently in different examples. Also, in an example, the oscillator generates, as the input signal, one of an injection locked signal having an external frequency of the external signal, a natural oscillation signal having the oscillation frequency, and an intermodulated signal having a frequency difference between the external frequency and the oscillation frequency, based on the values of the external frequency of the external signal and the oscillation frequency. For example, the oscillator may be an SRO. In such an example, the injection locked signal corresponds to a third mode, the natural oscillation signal corresponds to a first mode, and the intermodulated signal corresponds to a second mode.

In the example of FIG. 7, the capacitor included in the oscillator includes a capacitor bank configured as a plurality of capacitors. For example, the capacitor may further include a first capacitor bank configured to be swept based on a first capacitance unit, in response to a control code, and a second capacitor bank configured to be swept based on a second capacitance unit, in response to the control code. The first capacitance unit may be greater in than the second capacitance unit. The capacitance unit may indicate a measurement resolution of a variable capacitance in a corresponding capacitor. A method of tuning a capacitance using such a capacitor bank is described further with reference to FIGS. 15 through 17.

In the example of FIG. 7, the envelope detector 720 detects an envelope signal of the input signal. The envelope signal indicates a signal having an envelope frequency. If the input signal is generated in the second mode, the input signal is considered to be the signal in which the oscillation signal and the external signal are intermodulated. In such an example, the envelope frequency of the envelope signal extracted from the input signal is a frequency difference $|f_{DCO}-f_{EXT}|$ found between the oscillation frequency and the external frequency.

The frequency tuner 730 tunes the oscillation frequency of the oscillation signal based on the envelope frequency of the envelope signal. For example, the frequency tuner 730 tunes the oscillation frequency to minimize the envelope frequency.

In one example, the frequency tuner 730 tunes the oscillation frequency of the oscillation signal so that the envelope frequency of the envelope signal is less than or equal to a threshold frequency. Accordingly, the frequency tuner 730 controls a capacitance of the capacitor by determining a control code for the capacitor bank, and decreases the envelope frequency of the envelope signal by tuning the oscillation frequency appropriately.

In one example, the frequency tuner 730 includes a DC remover, an amplifier, a counter, and a comparator. In such an example, the DC remover removes a DC signal from the envelope signal, and extracts an alternating current (AC) signal from the envelope signal. The amplifier is further configured so that the gain is variable and amplifies the AC signal. The counter counts a number of oscillations that the amplified AC signal exceeds a threshold magnitude during a mask time. Thus, the comparator tunes the oscillation frequency based on the counted number of oscillations. For example, the comparator determines an appropriate control code to cause the capacitor of the oscillator to decrease the counted number of times. The mask time is described further with reference to FIG. 10.

FIGS. 8 through 11 are block diagrams illustrating examples of a configuration of a frequency calibration device.

A frequency calibration system 800 includes a signal transmission device 190 and a frequency calibration device. The signal transmission device 190 transmits an external signal having an external frequency $f_{ext}$ to the frequency calibration device for further manipulation.

Figure 8:
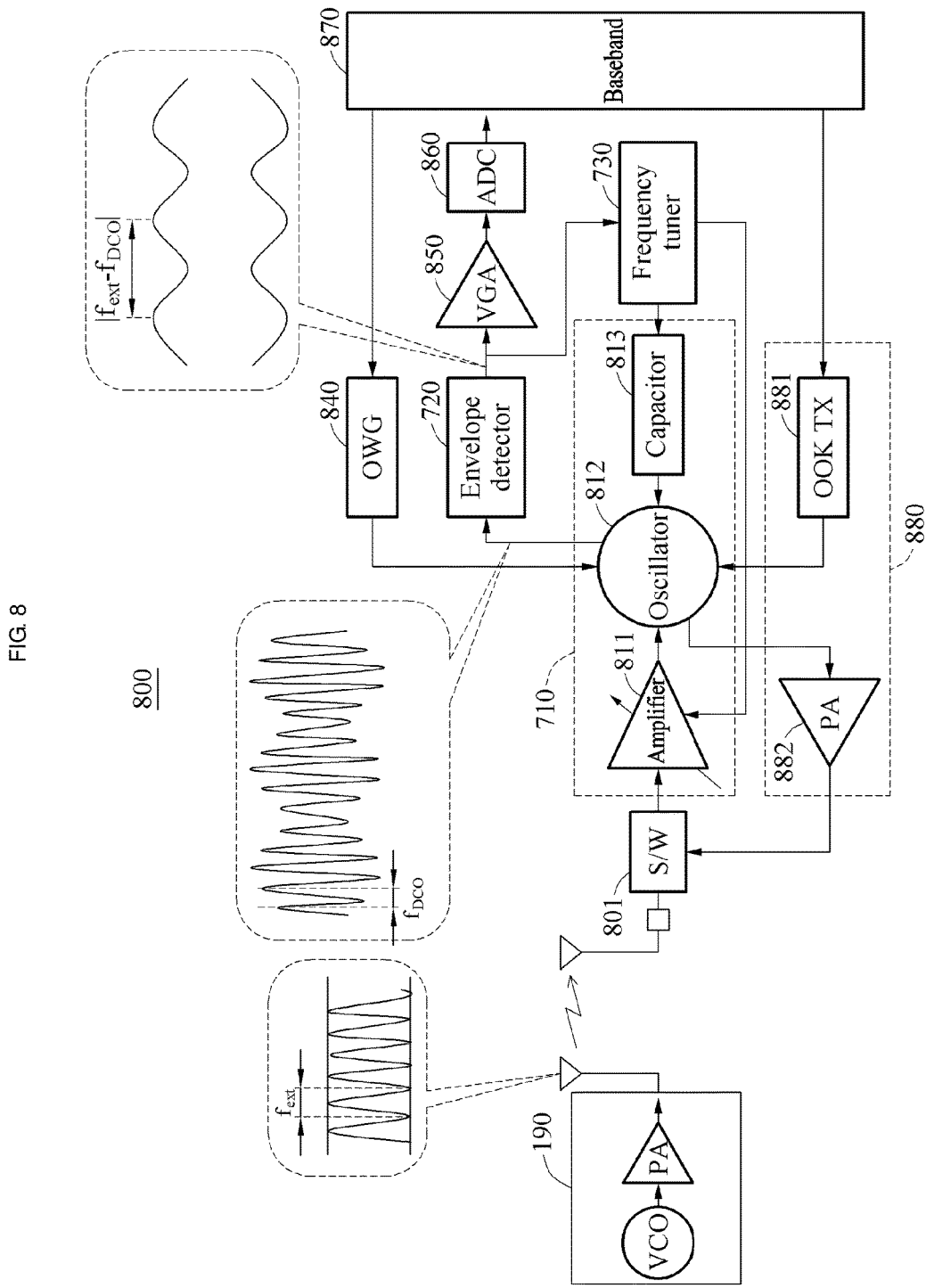
FIGS. 8 through 11 are block diagrams illustrating examples of a configuration of a frequency calibration device.

FIG. 8 illustrates an example of a reception path (RX path) via which the frequency calibration device receives the external signal from an outside area and a transmission path (TX path) via which the frequency calibration device transmits a signal to the outside area. A switch 801 connects one of the reception path and the transmission path to an antenna. Hence, only one path is active at any point in time.

In the example of FIG. 8, the frequency calibration device includes an input signal generator 710, an envelope detector 720, and a frequency tuner 730, and other similar elements, as the reception path. The reception path corresponds to an SRR.

The input signal generator 710 includes an amplifier 811, an oscillator 812, and a capacitor 813.

In the example of FIG. 8, the amplifier 811 amplifies the external signal received via the antenna based on a set gain value. In such an example, the gain is set so that the oscillator 812 generates, as the input signal, a signal in which an oscillation signal and the external signal are intermodulated. For example, such a signal is a signal in which the input signal is not locked to one of the oscillation signal and the external signal. In such an example, the gain of the amplifier 811 is set so that the input signal generated at the oscillator 812 has a frequency different from an external frequency of the external signal. The frequency calibration device prevents the input signal from having the external frequency by initializing the gain of the amplifier 811 to be a maximum gain of the amplifier 811. In this example, the gain of the amplifier 811 is variable. For example, the amplifier 811 may be a low noise amplifier (LNA). As another example, the amplifier 811 may be a signal feeding amplifier. However, other appropriate types of amplifiers are used in other examples.

In the example of FIG. 8, the oscillator 812 generates the input signal based on the amplified external signal received from the amplifier 811 and the oscillation signal. In such an example, a frequency of the input signal has an oscillation frequency $f_{DCO}$ as a primary component. An envelope of the signal corresponds to an envelope frequency. Accordingly, the oscillation signal is generated based on a quenching wave (QW) output from a QW generator 840 and the capacitor 813 included in the oscillator 812. An operating frequency of the oscillator 812 is also optionally referred to as an oscillation frequency and is controlled based on an LC tank of the oscillator 812.

Also, in the example of FIG. 8, the envelope detector 720 detects an envelope signal corresponding to an input signal from the input signal transferred from the input signal generator 710. Thus, in FIG. 8, the envelope signal has a frequency difference $|f_{ext}-f_{DCO}|$ between the external signal and the oscillation signal used as the envelope frequency. The envelope signal extracted at the envelope detector 720 includes relevant data, and is amplified appropriately through a variable gain amplifier (VGA) 850, and converted to a digital format through an analog-to-digital converter (ADC) 860. In such an example, the ADC 860 includes a 1-bit symbol detector.

Furthermore, in the example of FIG. 8, the frequency tuner 730 controls the capacitor 813 based on the envelope signal detected at the envelope detector 720. For example, the frequency tuner 730 tunes a capacitance of a capacitor bank included in the capacitor 813 by outputting a control code for controlling the capacitor bank. Thus, the oscillation frequency of the oscillator 812 varies based on the tuned capacitance. The frequency tuner 730 also matches the oscillation frequency of the oscillation signal to the external frequency by tuning the gain of the amplifier 811 so that the input signal is generated in an intermodulated mode, and by tuning the capacitance so that the envelope frequency of the envelope signal is less than or equal to a threshold frequency, for example, by selecting a control code so that the envelope frequency becomes zero.

In the example of FIG. 8, a baseband module 870 is a module configured to control an overall operation of the frequency calibration device. The baseband module 870 controls the QW generator 840 or receives the envelope signal to process data, or controls a transmitter 880 to transmit a signal to an outside area using the oscillator 812.

In such an example, the transmitter 880 is a transmission path of the frequency calibration device. The transmitter 880 transmits a signal to the outside area by using the oscillation frequency as tuned through the aforementioned process. For example, the oscillation frequency of the oscillator 812 is set to be the same as the external frequency of the external signal. In the example of FIG. 8, the transmitter 880 includes an ON/OFF keying (OOK) transmitter 881 and a power amplifier (PW) 882. The OOK transmitter 881 generates a signal including transmission data and transmits the signal to the outside area using the oscillator 812, which is, for example, an SRO.

Figure 9:
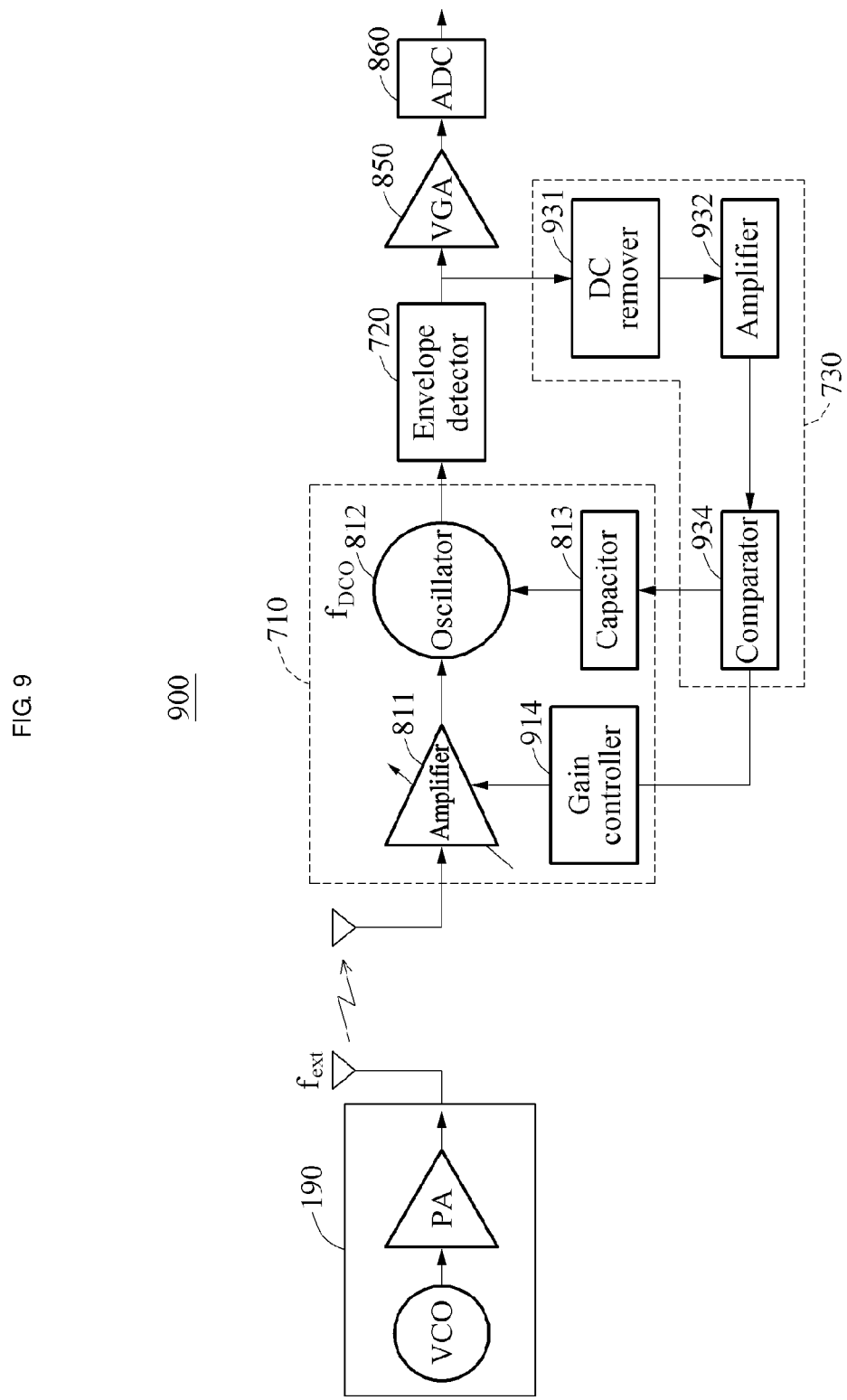

The signal transmission device 190, the amplifier 811, the oscillator 812, the capacitor 813, the envelope detector 720, the VGA 850, and the ADC 860 included in a frequency calibration system 900 of the example of FIG. 9 are the same as the corresponding signal transmission device 190, the amplifier 811, the oscillator 813, the envelope detector 720, the VGA 850, and the ADC 860 of FIG. 8. Thus, the repeated description of these elements of FIG. 9 is omitted here.

In the example of FIG. 9, the input signal generator 710 further includes a gain controller 914. In such an example, the gain controller 914 tunes a gain, in response to determining that an input signal is not a signal in which an external signal and an oscillation signal are intermodulated. As described above, the input signal generated at the oscillator 812 is classified into a first, a second, and a third mode. In a first mode, for example, the input signal having the oscillation frequency $f_{DCO}$ is generated. Further, in the second mode, for example, the input signal in which the oscillation frequency and the external frequency are intermodulated is generated. Finally, in the third mode, for example, the input signal is injection locked to the external frequency $f_{ext}$, based on a magnitude of the external signal. Also, the gain controller 914 tunes the gain so that the input signal in maintained to be in the second mode, as discussed above. The frequency calibration device performs fine frequency calibration of less than or equal to 100 ppm by tracking a frequency in the second mode, for example, the intermodulation mode.

In the example of FIG. 9, the frequency tuner 730 includes a DC remover 931, an amplifier 932, and a comparator 934. The DC remover 931 removes a DC signal from the envelope signal. The amplifier 932 amplifies an AC signal from which the DC signal is removed, and transfers the amplified signal to the comparator 934. In such an example, the amplifier 932 may be a rail-to-rail amplifier. However, other appropriate amplifiers are used as the amplifier 932 in another example. Thus, the comparator 934 controls the capacitor 813 and the gain controller 914 based on the envelope frequency that is estimated based on a number of times that the corresponding AC signal exceeds a threshold value during a mask time.

Figure 10:
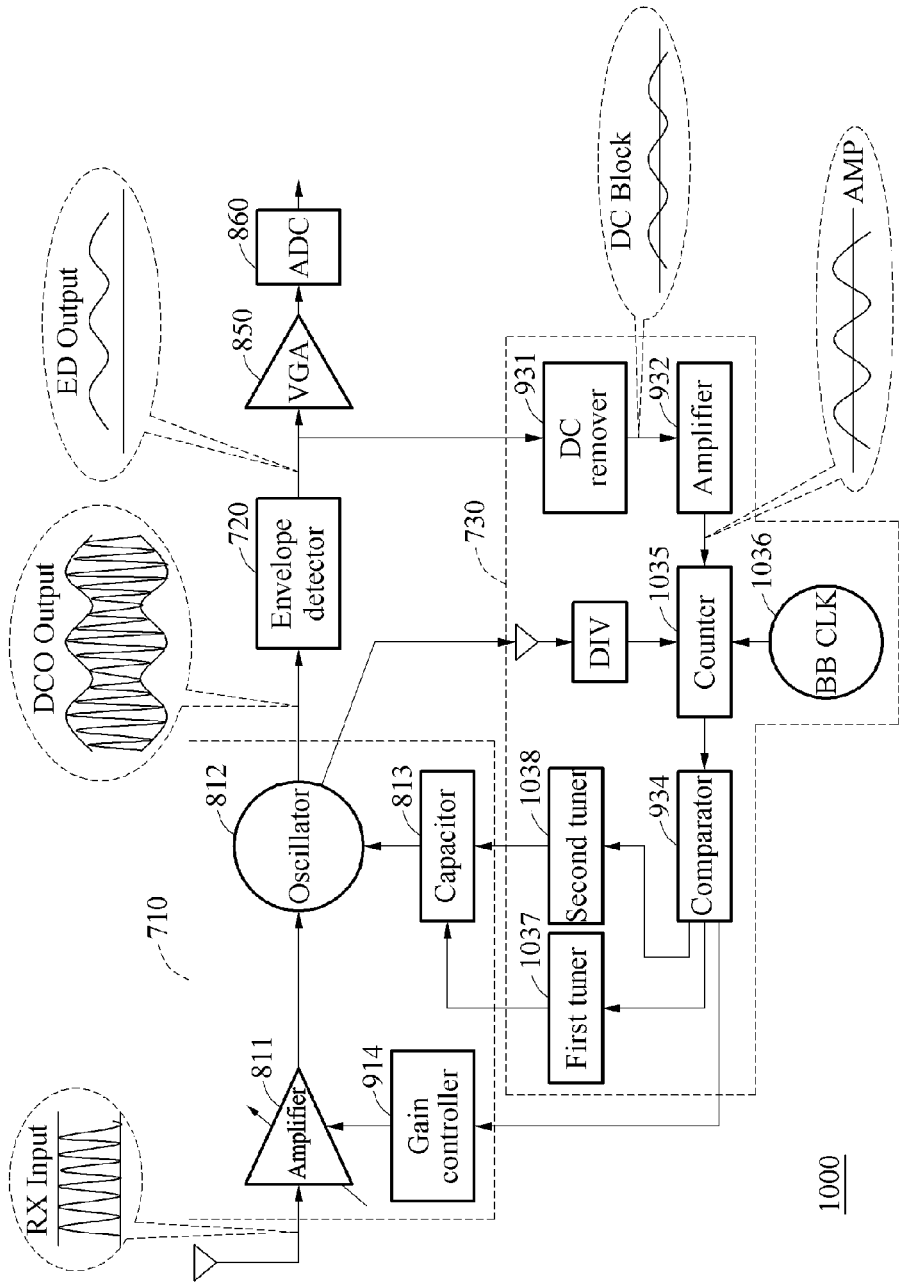

FIG. 10 illustrates an example of a frequency calibration device 1000 configured to coarsely tune an oscillation frequency and then finely tune the coarsely tuned oscillation signal based on an envelope frequency of an envelope signal.

In FIG. 10, the input signal generator 710, the amplifier 811, the oscillator 812, the capacitor 813, the gain controller 914, the envelope detector 720, the DC remover 931, the amplifier 932, the VGA 850, and the ADC 860 are the same as the corresponding input signal generator 710, the amplifier 811, the oscillator 812, the capacitor 813, the gain controller 914, the envelope detector 720, the DC remover 931, the amplifier 932, the VGA 850, and the ADC 860 of the example of FIG. 9. Thus, the repeated description is omitted here.

However, referring to the example of FIG. 10, the amplifier 811 amplifies an external signal, for example, an RX input, based on the tuned gain, and transfers the amplified external signal to the oscillator 812. The oscillator 812 of the frequency calibration device 1000 generates an inter-modulated input signal, for example, a DCO output, based on the amplified external signal and the oscillation signal. The envelope detector 720 extracts an envelope signal, for example, an ED output, which is an envelope of the input signal. The envelope signal may be a signal represented as a set of peak points of the input signal output from the oscillator 812. The DC remover 931 generates an AC signal, for example, a DC block, from which a DC signal is removed. The amplifier 932 generates a signal, for example, an AMP, acquired by amplifying the amplitude of the AC signal and transfers the amplified signal to a counter 1035.

The counter 1035 counts a number of oscillations that occur during a mask time. For example, the counter 1035 counts a number of oscillations that the amplified AC signal exceeds a threshold magnitude during the mask time. The mask time is determined based on a baseband clock (BB CLK) 1036 as a time interval metric so that the counter 1035 successfully counts an number of oscillations associated with the AC signal to estimate the frequency, for example, an envelope frequency, of the AC signal. For example, the counter 1035 counts a number of times that a peak point of the AC signal appears during the mask time. The frequency of the AC signal corresponds to the determined envelope frequency. Thus, the counter 1035 calculate the envelope frequency based on a mask time as compared to the counted number of times.

In the example of FIG. 10, the comparator 934 controls the gain controller 914, a first tuner 1037, and a second tuner 1038, based on the envelope frequency estimated at the counter 1035. For example, the comparator 934 controls at least one of the gain controller 914, the first tuner 1037, and the second tuner 1038 in order to remove or decrease the envelope frequency in response to a presence of the envelope frequency. For example, the comparator 934 controls the gain of the amplifier 811 through using the gain controller 914 so that the input signal output from the oscillator 812 becomes a signal in which the oscillation signal and the external signal are intermodulated. As another example, the capacitor 813 includes a first capacitor configured to be swept based on the operation of a first capacitance unit and a second capacitor configured to be swept based on the operation of a second capacitance unit. In such an example, the first tuner 1037 controls the first capacitor and the second tuner 1038 controls the second capacitor. At a primary stage, the comparator 934 tunes the envelope frequency to be less than or equal to a first threshold frequency, for example, 2 MHz, by coarsely tuning a capacitance of the capacitor through the operation of the first tuner 1037. At a secondary stage, the comparator 934 tunes the envelope frequency to be less than or equal to a second threshold frequency, for example, 40 kHz, which is a factor of less than 100 ppm, by finely tuning the capacitance through the second tuner 1038.

As a result, the comparator 934 of the frequency tuner 730 tunes the capacitance of the capacitor 813 connected to the oscillator 812 so that the envelope frequency becomes less than or equal to the threshold frequency through performing the two stages.

Figure 11:
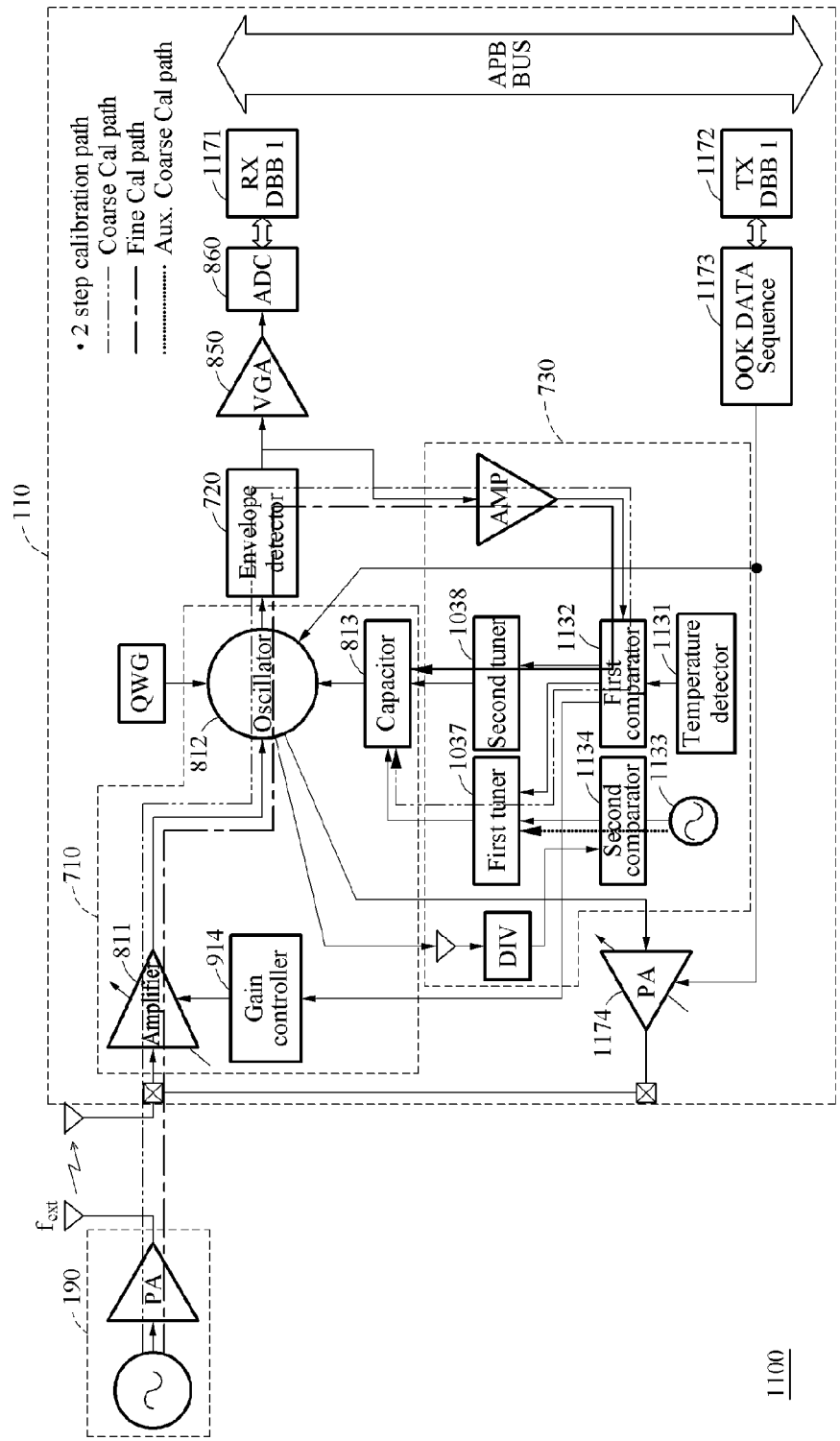

FIG. 11 illustrates an example of a frequency calibration system 1100 configured to calibrate a frequency based on a temperature.

The input signal generator 710, the amplifier 811, the oscillator 812, the capacitor 813, the gain controller 914, the envelope detector 720, the first tuner 1037, the second tuner 1038, the VGA 850, and the ADC 860 of FIG. 11 are the same as the corresponding input signal generator 710, the amplifier 811, the oscillator 812, the capacitor 813, the gain controller 914, the envelope detector 720, the first tuner 1037, the second tuner 1038, the VGA 850, and the ADC 860 of FIG. 9. Thus, the repeated description is omitted here. Likewise, the signal transmission device 190 of FIG. 11 is same as the signal transmission device 190 of FIG. 9. Thus, the repeated description of these elements is omitted.

In the example of FIG. 11, a reception digital baseband (RX DBB) 1171 is a module configured to receive data that has passed through the ADC 860, and configured to process the received data. The processed data is transferred to a processor through a data bus, for example, an APB bus, as shown in the example of FIG. 11.

A transmission digital baseband (TX DBB) 1172 is a module configured to transmit the signal transferred through the data bus to an outside area through a transmission path. For example, the TX DBB 1172 generates an ON-OFF keying (OOF) data sequence 1173, transfers the generated OOF data sequence 1173 to an antenna through a transmission amplifier 1174, and transmits the OOF sequence 1173 to the outside area.

According to the example of FIG. 11, the frequency tuner 730 further includes a temperature detector 1131, a first comparator 1132, a baseband clock 1133, and a second comparator 1134 in addition to including the first tuner 1037 and the second tuner 1038.

In such an example, the temperature detector 1131 measures a temperature associated with at least a portion of the frequency calibration device 110. For example, the temperature detector 1131 is configured to measure a temperature of a portion that receives a relatively great effect with respect to the oscillation frequency of the oscillator 812 within the frequency calibration device 110.

Thus, the first comparator 1132 included in the frequency tuner 730 performs a similar operation as the comparator 934 of FIG. 9. Furthermore, in response to the measured temperature exceeding a threshold temperature, the first comparator 1132 detects the envelope signal and again tunes the oscillation frequency. For example, the threshold temperature is set to a temperature that may affect the oscillation frequency of the oscillator 812. For example, the threshold temperature is set to 10° C. In such an example, If the temperature of the frequency calibration device 110 exceeds 10° C., the frequency calibration device 110 performs frequency calibration again although a frequency calibration process is already terminated.

The second comparator 1134 included in the frequency tuner 730 tunes the oscillation frequency of the oscillator 812 through the first tuner 1037, based on the baseband clock 1133. For example, in response to a definition of a frequency channel of the external signal, the second comparator 1134 initializes a target frequency set for the frequency channel to be the oscillation frequency based on the baseband clock 1133.

The first comparator 1132 performs coarse calibration and fine calibration, and the second comparator 1134 performs auxiliary coarse calibration. For example, the coarse calibration is performed in such a manner that the frequency calibration device 110 repeats a process of sequentially operating the amplifier 811, the oscillator 812, the envelope detector 720, the first comparator 1132, and the first tuner 1037 to maintain coarse calibration. For example, the oscillation frequency is tuned based on a unit of 1 MHz for the tuning. The fine calibration is performed in such a manner that the frequency calibration device 110 repeats a process of sequentially operating the amplifier 811, the oscillator 812, the envelope detector 720, the comparator, and the second tuner 1038. In such an example, the oscillation frequency may be tuned based on a unit of 100 ppm for the tuning. Also, the auxiliary coarse calibration is performed in such a manner that the frequency calibration device 110 operates the baseband clock 1133 and the second comparator 1134 in an initial state. In such an example, the oscillation frequency is tuned based on a unit of 1 MHz. Additionally, in such an example, the capacitor includes a first capacitor bank and a second capacitor bank. For example, the first capacitor bank is a metal-insulator-metal (MIM) bank configured to be swept based on a unit of 1 MHz, and the second capacitor bank is a varactor pair configured to be swept based on a unit of 40 ppm.

Figure 12:
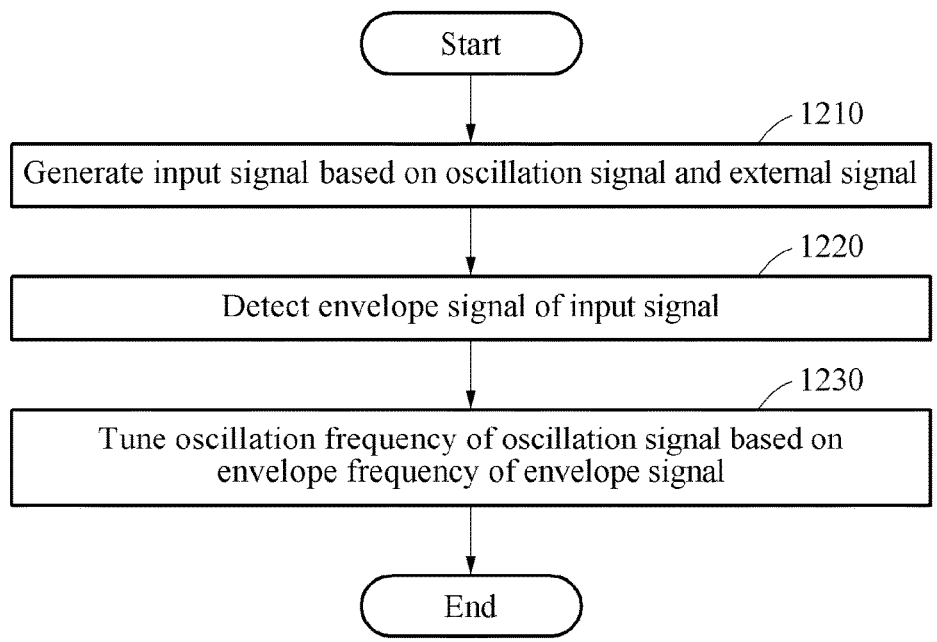
FIG. 12 is a flowchart illustrating an example of a frequency calibration method.

FIG. 12 is a flowchart illustrating an example of a frequency calibration method.

Referring to FIG. 12, in operation 1210, the frequency calibration device generates an input signal based on an oscillation signal and an external signal. For example, an oscillator of the frequency calibration device generates an input signal in which the oscillation signal and the external signal are intermodulated using the oscillation signal and the external signal. Accordingly, the frequency calibration device tunes a gain of the external signal to intermodulate the oscillation signal and the external signal.

In operation 1220, the frequency calibration device detects an envelope signal of the input signal. For example, the envelope signal of the input signal in which the oscillation signal and the external signal are intermodulated is based on a frequency difference between an oscillation frequency of the oscillation signal and an external frequency of the external signal.

In operation 1230, the frequency calibration device tunes the oscillation frequency of the oscillation signal based on an envelope frequency of the envelope signal. In one example, the frequency calibration device tunes the oscillation frequency so that the envelope frequency becomes less than or equal to a threshold frequency. For example, the frequency calibration device tunes the oscillation frequency by changing a capacitance of an oscillator, and sequentially changes the capacitance until the envelope frequency is not detected. Thus, the frequency calibration device tunes a gain for amplifying the external signal, in response to an envelope frequency detected from a capacitance, set prior to the changing, becoming a capacitance from which an envelope frequency is not detected that exceeds the threshold frequency. In addition, the frequency calibration device maintains the capacitance, in response to the envelope frequency detected from the capacitance set prior to changing to the capacitance from which the envelope frequency is not detected being less than or equal to the threshold frequency. A capacitance change process is further described with reference to FIGS. 13 and 14.

In one example, the frequency calibration device changes a capacitance of at least one of a first capacitor, for example, a 56 fF MIM capacitor, and a second capacitor, for example, a 1-2 fF metal oxide semiconductor (MOS) capacitor, which are included as elements in the oscillator. For example, the first capacitor is configured to control the oscillation frequency at a resolution of about 1 MHz, and the second capacitor is configured to control the oscillation frequency at a resolution of about 10 to 20 kHz.

Figure 13:
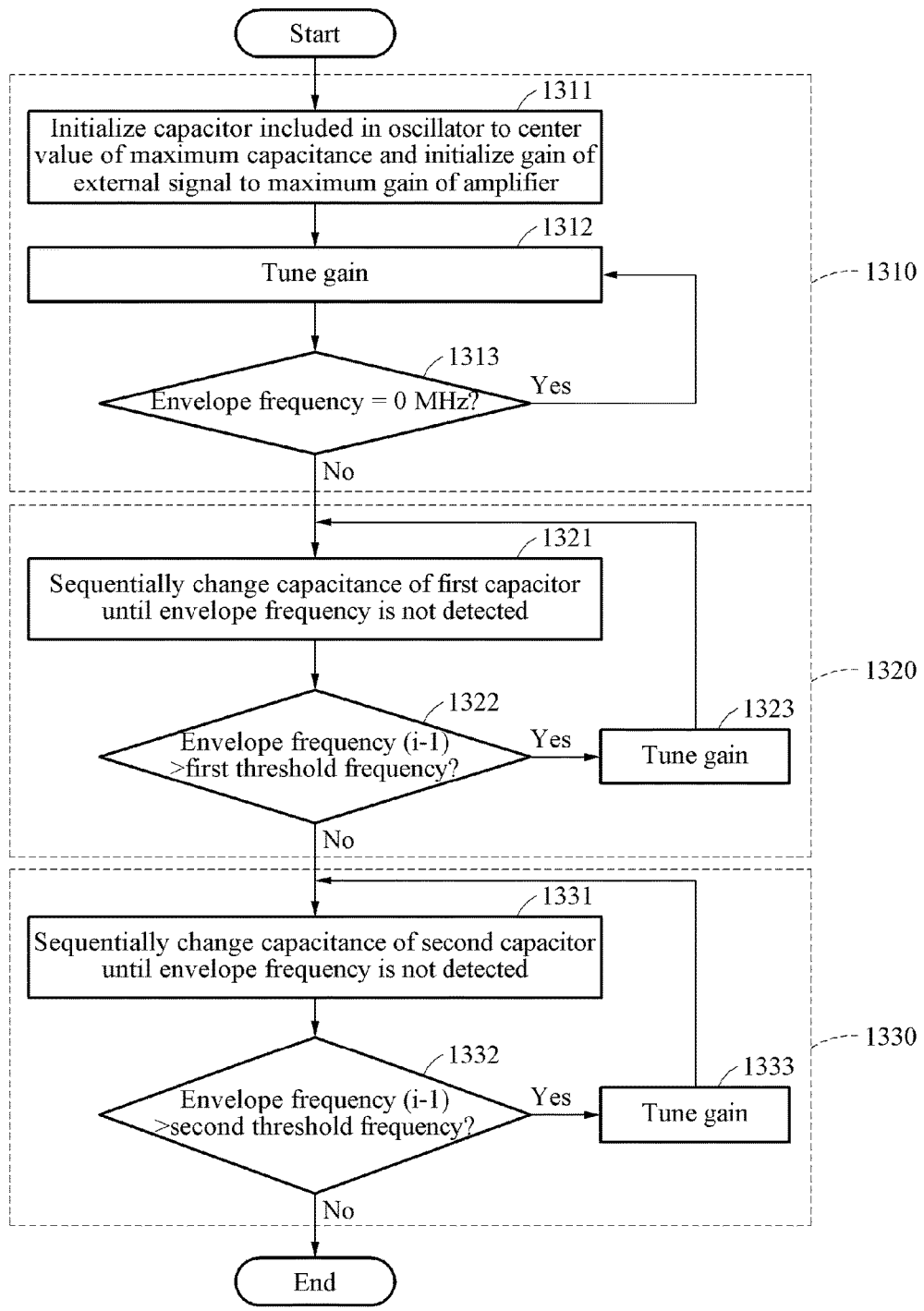
FIGS. 13 and 14 are flowcharts illustrating examples of a frequency calibration method.
Figure 14:
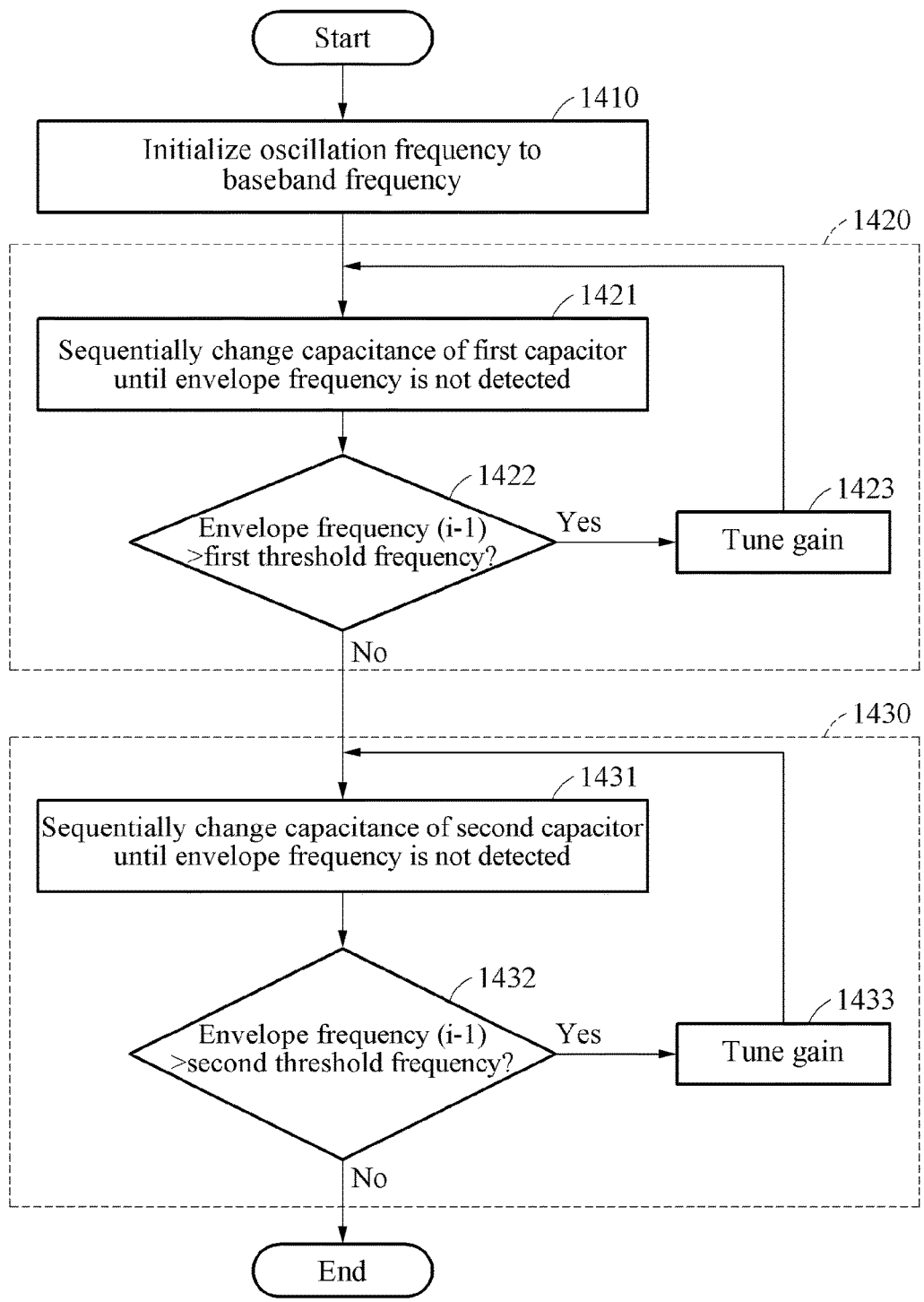

FIGS. 13 and 14 are flowcharts illustrating examples of a frequency calibration method.

FIG. 13 is a flowchart illustrating a frequency calibration method in an example in which a target channel corresponding to an external signal is not provided. Because the target channel is not provided, the frequency calibration device performs an initialization process as provided in operation 1310.

More particularly, in operation 1310, the frequency calibration device tunes a gain of an external signal so that an input signal output from an oscillator becomes an intermodulated signal. For example, in operation 1311, the frequency calibration device initializes a capacitor included in the oscillator to a center value of a maximum capacitance and initializes the gain of the external signal to a maximum gain of an amplifier. In operation 1312, the frequency calibration device tunes the gain so that an envelope frequency is detected. For example, since the gain of the amplifier is initialized to the maximum gain in operation 1311, a gain controller gradually decreases the gain of the amplifier. In operation 1313, the frequency calibration device determines whether the envelope frequency is 0 MHz. The frequency calibration device tunes the gain in response to not detecting the envelope frequency from the envelope signal, and repeats tuning of the gain until the envelope frequency is detected successfully.

In an example, when the envelope frequency is not detected in an initial state, the input signal generated at the oscillator may be locked to the oscillation signal or the external signal. For example, the frequency calibration device maintains the input signal to be in a mode in which the oscillation signal and the external signal are intermodulated by tuning the gain of the external signal until the envelope frequency is successfully detected from the input signal.

In operation 1320, the frequency calibration device coarsely tunes the capacitor included in the oscillator. For example, the frequency calibration device primarily tunes a capacitance of a first capacitor bank in the capacitor bank.

In one example, in operation 1321, the frequency calibration device sequentially changes a capacitance of the first capacitor until the envelope frequency is not detected. For example, the frequency calibration device sequentially increases the capacitance of the first capacitor until the envelope frequency is not detected. However, such an approach of coarsely tuning the capacitor is only one example and the examples are not limited thereto. Thus, if the envelope frequency increases even after increasing the capacitance of the first capacitor, the frequency calibration device accordingly sequentially decreases the capacitance of the first capacitor.

In operation 1322, the frequency calibration device determines whether an envelope frequency corresponding to an (i−1)-th capacitance is greater than a first threshold frequency. Here, i refers to an integer greater than or equal to 1 and an i-th capacitance denotes a first capacitance value set so that the envelope frequency is not detected with respect to the first capacitor bank.

In operation 1323, in response to the envelope frequency corresponding to the (i−1)-th capacitance being determined to be less than or equal to the first threshold frequency, the frequency calibration device tunes the gain of the external signal and repeats a process according to operation 1321.

In further detail, the frequency calibration device tunes a gain for amplifying the external signal and then changes the capacitance of the first capacitor again, in response to an envelope frequency detected from the envelope signal exceeding a first threshold frequency in a state in which the first capacitor is set to a capacitance, for example, the (i−1)-th capacitance, changed prior to changing to another capacitance, for example, the i-th capacitance, at which an envelope frequency is not detected.

In operation 1330, the frequency calibration device finely tunes the capacitor included in the oscillator. For example, the frequency calibration device secondarily tunes a capacitance of a second capacitor bank present in the capacitor bank. In such an example, the second capacitor bank is swept by each second capacitance unit, and the first capacitor bank is swept by each first capacitance unit. In such an example, the first capacitance unit is greater than the second capacitance unit.

In one example, in operation 1331, the frequency calibration device sequentially changes a capacitance of a second capacitor until the envelope frequency is not detected. For example, the frequency calibration device sequentially increases the capacitance of the second capacitor until the envelope frequency is no longer detected. However, such an approach is only one example and the examples are not limited thereto. If the envelope frequency increases even after increasing the capacitance of the second capacitor, the frequency calibration device sequentially decreases the capacitance of the second capacitor accordingly.

In operation 1332, the frequency calibration device determines whether the envelope frequency corresponding to the (i−1)-th capacitance is greater than a second threshold frequency. In this operation, i refers to an integer greater than or equal to 1 and an i-th capacitance refers to a first capacitance value set so that the envelope frequency is not detected with respect to the second capacitor bank. In such an operation, i of operation 1332 is possibly different from i of operation 1322.

In operation 1333, in response to the envelope frequency corresponding to the (i−1)-th capacitance being less than or equal to the second threshold frequency, the frequency calibration device tunes the gain of the external signal and repeats the process of fine tuning beginning with operation 1331.

In further detail, the frequency calibration device sequentially changes a capacitance of the second capacitor until the envelope frequency is not detected. Such changing occurs in response to the envelope frequency detected from the envelope signal being less than or equal to the first threshold frequency in a state in which the first capacitor is set to the capacitance, for example, the (i−1)-th capacitance, changed prior to changing to the capacitance, for example, the i-th capacitance, from which the envelope frequency is not detected. Also, the frequency calibration device tunes the gain for amplifying the external signal and then changes the capacitance of the second capacitor again. Such tuning occurs in response to the envelope frequency detected from the envelope signal exceeding a second threshold frequency in a state in which the second capacitor is set to the capacitance, for example, the (i−1)-th capacitance, changed prior to changing to the capacitance from which the envelope frequency is not detected.

For example, the frequency calibration device maintains the capacitance of the first capacitor and the capacitance of the second capacitor. Such maintaining occurs in response to the envelope frequency detected from the envelope signal being less than or equal to the second threshold frequency in a state in which the second capacitor is set to the capacitance, for example, the (i−1)-th capacitance, changed to prior to changing to the capacitance from which the envelope frequency is not detected. In one such example, if the second threshold frequency is set to 100 ppm, the envelope frequency corresponding to the (i−1)-th capacitance is already less than or equal to 100 ppm. Accordingly, it is possible to guarantee that the envelope frequency corresponding to the i-th capacitance is less than or equal to 100 ppm because of the operation of the frequency calibration device. In such an example, the envelope frequency corresponds to a frequency difference between the oscillation frequency and the external frequency.

FIG. 14 is a flowchart illustrating an example of a frequency calibration method in an example in which a target channel corresponding to an external signal is given. Because the target channel is given, the frequency calibration device performs an initialization process as in operation 1410.

In operation 1410, the frequency calibration device initializes an oscillation frequency to a baseband frequency. For example, in response to the target channel corresponding to the external signal being given, the frequency calibration device coarsely initializes the oscillation frequency using the baseband signal. For example, a baseband clock having a performance of 600 ppm is used to generate a signal of a baseband frequency. For example, such a frequency is 0.2598 MHz, found as the product 600 ppm×433 MHz. In such an example, a capacitor included in the baseband clock is an MIM capacitor configured to be swept based on a unit of 1 MHz. In one example, the frequency calibration device may initialize the oscillation frequency so that an error between the oscillation frequency and the external frequency is less than about 1.5 MHz using the baseband frequency.

The frequency calibration device perform operations 1420, 1421, 1422, 1423, 1430, 1431, 1432, and 1433 in a similar manner to operations 1320, 1321, 1322, 1323, 1330, 1331, 1332, and 1333 of FIG. 13 and hence the descriptions of these operations is omitted here.

Figure 15:
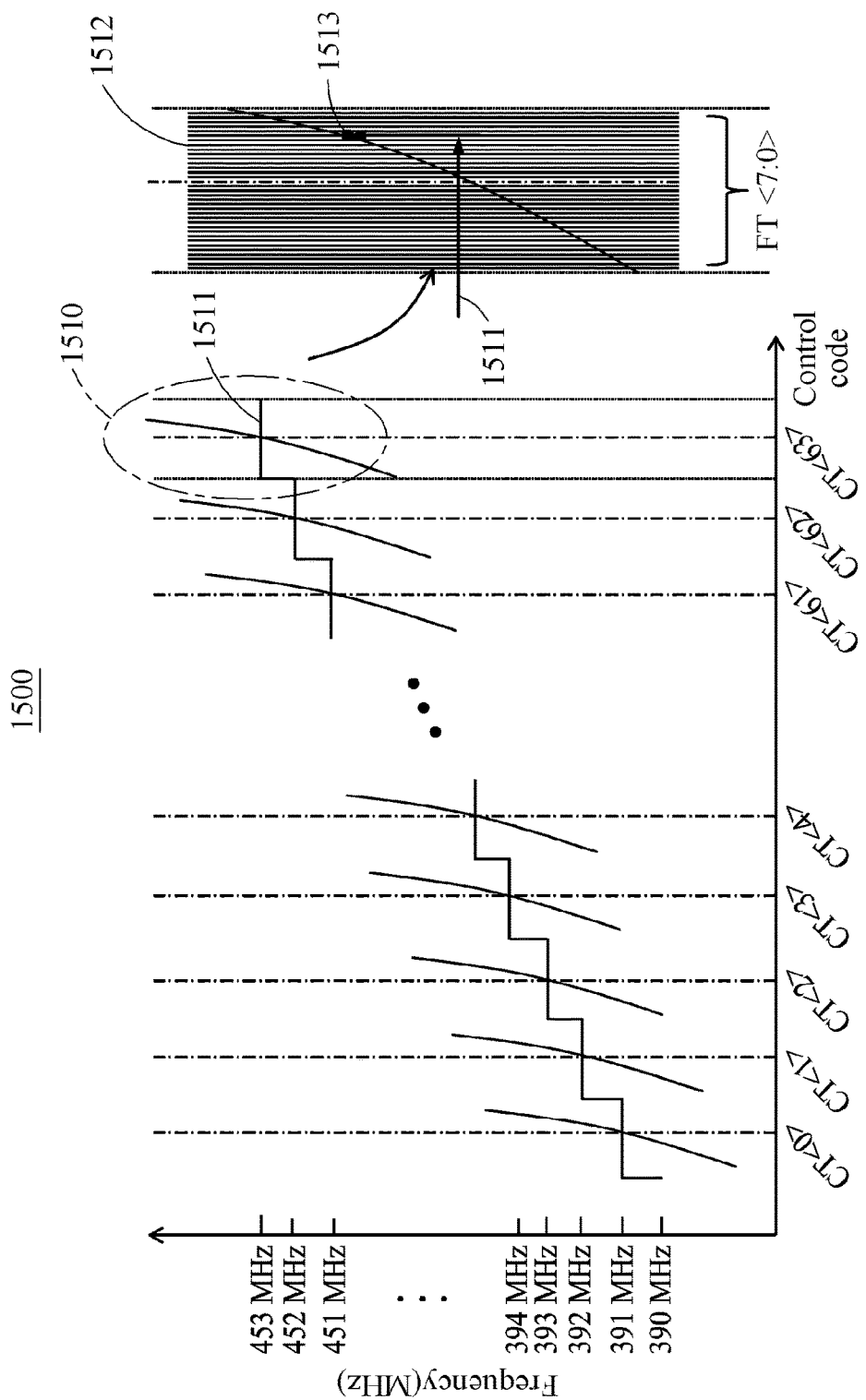
FIGS. 15 through 17 illustrate examples of controlling a capacitor bank that configures an oscillator in a frequency calibration device.
Figure 16:
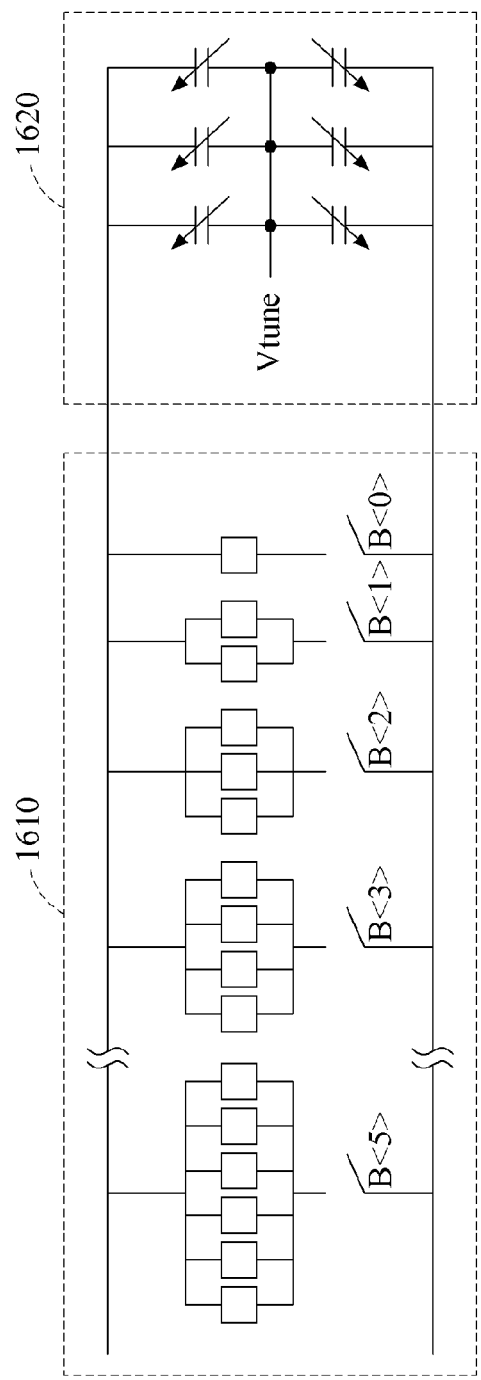
Figure 17:
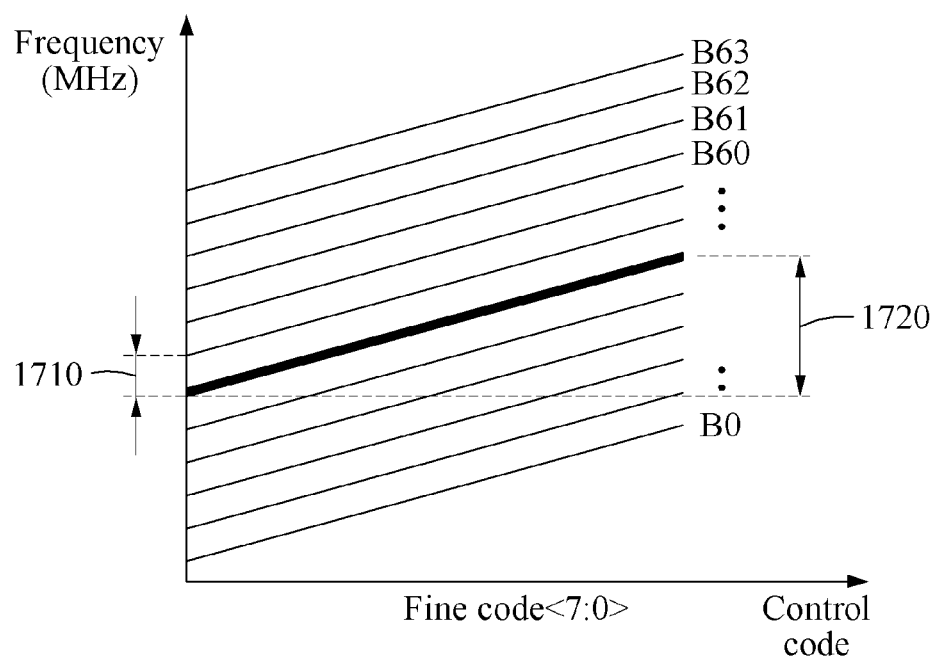

FIGS. 15 through 17 illustrate examples of controlling a capacitor bank that configures an oscillator in a frequency calibration device.

For example, an oscillator of the frequency calibration device includes a capacitor and the capacitor is a capacitor bank. FIG. 15 is a graph showing an example of an oscillation frequency tunable at a corresponding capacitor bank when a first capacitor bank is allocated to a coarse portion of the capacitor bank and a second capacitor bank is allocated to a fine portion of the capacitor bank. For example, FIG. 15 illustrates the oscillation frequency of the oscillator based on an example in which the first capacitor bank is a 56 fF MIM capacitor set to be swept based on a unit of 1 MHz and the second capacitor bank is a 1.5 fF MOS varactor, with respect to a 600 ppm resistance-capacitance (RC) oscillator.

In a graph 1500 of FIG. 15, the y axis refers to an oscillation frequency that is determined based on an LC tank included in the oscillator and x axis refers to a first control code for controlling a coarse portion among control codes for controlling the capacitor bank. In the example of FIG. 15, a capacitance 1511 of the first capacitor bank is swept by each first capacitance unit, based on a capacitor that is to be activated in response to a first control code. Referring to the example of FIG. 15, the first capacitor bank is configured based on a binary size, and every time each capacitor included in the first capacitor bank is activated, a capacitance of the first capacitor bank increases by each capacitance of the corresponding capacitor. Although FIG. 15 illustrates the first capacitance unit as being 1 MHz, it is only an example and may be modified in other examples to take on a different value.

The frequency calibration device determines the capacitance 1511 of the first capacitor bank based on the first control code and determines a capacitance 1513 of the second capacitor bank based on a second control code 1512. An area 1510 of FIG. 15 represents a range tunable at the second capacitor bank. A capacitance of the capacitor bank is a value acquired by adding the capacitance determined at the second capacitor bank to the capacitance 1511 determined at the first capacitor bank. For example, the capacitance of the second capacitor bank is determined based on the second control code 1512 used for controlling a fine portion.

FIG. 16 illustrates an example of a capacitor bank. Referring to FIG. 16, the capacitor bank includes a first capacitor bank 1610 and a second capacitor bank 1620. The first capacitor bank 1610 is allocated to being a capacitance of a coarse portion in the capacitor bank and the second capacitor bank 1620 is allocated to being a capacitance of a fine portion in the capacitor bank. FIG. 17 is a graph showing an example of a capacitance settable at the capacitor bank of FIG. 16. In FIG. 17, the y axis denotes an oscillation frequency corresponding to a capacitance determined at the capacitor bank and the x axis denotes a second control code corresponding to the fine portion. Each line of FIG. 17 represents a change in an oscillation frequency according to a change in a magnitude of the second capacitance bank based on the capacitance determined at the first capacitor bank corresponding to the coarse portion. The frequency calibration device sweeps the first capacitor bank by each first capacitance unit 1710, and performs fine calibration within a variable capacitance range 1720 of the second capacitor bank. For example, once a first capacitance of the first capacitor bank is determined, a second capacitance of the second capacitance bank is added to the determined first capacitance and a final capacitance is determined.

The elements in FIGS. 1-17 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-17 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A frequency calibration device, comprising:
   an input signal generator configured to generate an input signal based on an oscillation signal and an external signal;
   an envelope detector configured to detect an envelope signal corresponding to the input signal; and
   a frequency tuner configured to tune an oscillation frequency of the oscillation signal based on an envelope frequency corresponding to the envelope signal.

2. The frequency calibration device of claim 1, wherein the input signal generator comprises an amplifier configured to amplify the external signal based on a gain set so that an oscillator generates a signal in which the oscillation signal and the external signal are intermodulated as the input signal.

3. The frequency calibration device of claim 2, wherein the input signal generator comprises a gain controller configured to tune the gain in response to determining that the input signal is not the signal in which the oscillation signal and the external signal are intermodulated.

4. The frequency calibration device of claim 1, wherein the frequency tuner is further configured to tune the oscillation frequency of the oscillation signal so that the envelope frequency of the envelope signal is less than or equal to a threshold frequency.

5. The frequency calibration device of claim 1, wherein the input signal generator comprises an oscillator comprising an inductor and a capacitor, and configured to operate at an oscillation frequency determined by the inductor and the capacitor, and the oscillator is further configured to generate, as the input signal, one of an injection locked signal having an external frequency of the external signal, a natural oscillation signal having the oscillation frequency, and an intermodulated signal having a value of a frequency difference between the external frequency and the oscillation frequency, based on the external frequency of the external signal and the oscillation frequency.

6. The frequency calibration device of claim 5, wherein the capacitor comprises a capacitor bank that comprises capacitors, and the frequency tuner is further configured to control a capacitance of the capacitor by determining a control code for the capacitor bank, and to decrease the envelope frequency of the envelope signal by tuning the oscillation frequency.

7. The frequency calibration device of claim 5, wherein the capacitor comprises:

a first capacitor bank configured to be swept based on a first capacitance unit in response to a control code; and a second capacitor bank configured to be swept based on a second capacitance unit in response to the control code, wherein the first capacitance unit is greater than the second capacitance unit.

8. The frequency calibration device of claim 1, wherein the frequency tuner comprises:

a direct current remover configured to remove a direct current signal from the envelope signal, and to extract an alternating current signal;

an amplifier configured to amplify the alternating current signal to produce an amplified alternating current signal;

a counter configured to count a number of oscillations in which the amplified alternating current signal exceeds a threshold magnitude during a mask time; and a comparator configured to tune the oscillation frequency based on the counted number of oscillations.

9. The frequency calibration device of claim 1, further comprising:

a transmitter configured to transmit a signal to an outside area based on the tuned oscillation frequency.

10. The frequency calibration device of claim 1, wherein the input signal generator is further configured to initialize the oscillation frequency to a target frequency set for a frequency channel of the external signal, in response to definition of the frequency channel of the external signal.

11. The frequency calibration device of claim 1, further comprising:

a temperature measurer configured to measure a temperature of at least a portion of the frequency calibration device, wherein the frequency tuner is further configured to detect the envelope signal and to tune the oscillation frequency again in response to the measured temperature being greater than a threshold temperature.

12. A frequency calibration method comprising:

generating an input signal based on an oscillation signal and an external signal;

detecting an envelope signal of the input signal; and tuning an oscillation frequency of the oscillation signal based on an envelope frequency corresponding to the envelope signal.

13. The method of claim 12, further comprising:

amplifying the external signal based on a gain;

tuning the gain in response to not detecting the envelope frequency from the envelope signal; and repeatedly tuning the gain until the envelope frequency is detected.

14. The method of claim 12, wherein the tuning of the oscillation frequency comprises tuning the oscillation frequency of the oscillation signal so that the envelope frequency of the envelope signal is less than or equal to a threshold frequency.

15. The method of claim 12, wherein the tuning of the oscillation frequency comprises:

tuning the oscillation frequency by changing a capacitance of an oscillator;

sequentially changing the capacitance until the envelope frequency is not detected;

tuning a gain for amplifying the external signal, in response to an envelope frequency detected from a capacitance set prior to changing to a capacitance from which an envelope frequency is not detected exceeding a threshold frequency; and maintaining the capacitance, in response to the envelope frequency detected from the capacitance set prior to changing to the capacitance from which the envelope frequency is not detected being less than or equal to the threshold frequency.

16. The method of claim 12, wherein the tuning of the oscillation frequency comprises changing a capacitance of at least one of a first capacitor and a second capacitor included in an oscillator.

17. The method of claim 16, wherein the changing of the capacitance comprises:

sequentially changing a capacitance of the first capacitor until the envelope frequency is not detected;

tuning a gain for amplifying the external signal and then changing the capacitance of the first capacitor again, in response to the envelope frequency detected from the envelope signal exceeding a first threshold frequency in a state in which the first capacitor is set to a capacitance changed prior to changing to a capacitance from which an envelope frequency is not detected;

sequentially changing a capacitance of the second capacitor until the envelope frequency is not detected, in response to the envelope frequency detected from the envelope signal being less than or equal to the first threshold frequency in a state in which the first capacitor is set to the capacitance changed prior to changing to the capacitance from which the envelope frequency is not detected;

tuning the gain for amplifying the external signal and then changing the capacitance of the second capacitor again, in response to the envelope frequency detected from the envelope signal exceeding a second threshold frequency in a state in which the second capacitor is set to the capacitance changed prior to changing to the capacitance from which the envelope frequency is not detected; and maintaining the capacitance of the first capacitor and the capacitance of the second capacitor in response to the envelope frequency detected from the envelope signal being less than or equal to the second threshold frequency in a state in which the second capacitor is set to the capacitance changed to prior to changing to the capacitance from which the envelope frequency is not detected.

18. The method of claim 12, further comprising:
initializing a capacitor included in an oscillator to a center value of a maximum capacitance of the capacitor; and
initializing a gain of the external signal to a maximum gain of an amplifier.

19. The method of claim 12, further comprising:
coarsely initializing the oscillation frequency based on a baseband frequency, in response to a target channel given to correspond to the external signal.

20. A non-transitory computer-readable medium storing instructions that, when executed by a processor, cause the processor to perform the method of claim 12.

* * * * *